United States Patent
Ezaki et al.

(10) Patent No.: US 7,277,320 B2
(45) Date of Patent: Oct. 2, 2007

(54) MAGNETIC MEMORY DEVICE, SENSE AMPLIFIER CIRCUIT AND METHOD OF READING FROM MAGNETIC MEMORY DEVICE

(75) Inventors: Joichiro Ezaki, Tokyo (JP); Yuji Kakinuma, Tokyo (JP); Keiji Koga, Tokyo (JP); Shigekazu Sumita, Tokyo (JP)

(73) Assignee: TDK Corporation, Tokyo (JP)

( * ) Notice: Subject to any disclaimer, the term of this patent is extended or adjusted under 35 U.S.C. 154(b) by 186 days.

(21) Appl. No.: 10/550,105

(22) PCT Filed: Mar. 23, 2004

(86) PCT No.: PCT/JP2004/003973

§ 371 (c)(1),
(2), (4) Date: Oct. 31, 2005

(87) PCT Pub. No.: WO2004/086407

PCT Pub. Date: Oct. 7, 2004

(65) Prior Publication Data

US 2006/0120146 A1 Jun. 8, 2006

(30) Foreign Application Priority Data

Mar. 24, 2003 (JP) .............................. 2003-81251

(51) Int. Cl.
*G11C 11/14* (2006.01)
*G11C 7/02* (2006.01)
(52) U.S. Cl. ...................... 365/171; 365/207
(58) Field of Classification Search ............... 365/171, 365/158, 207, 173
See application file for complete search history.

(56) References Cited

U.S. PATENT DOCUMENTS

| 5,281,873 | A | 1/1994 | Seki | |
|---|---|---|---|---|
| 6,188,615 | B1 * | 2/2001 | Perner et al. | 365/189.01 |
| 6,396,733 | B1 * | 5/2002 | Lu et al. | 365/158 |
| 6,600,690 | B1 * | 7/2003 | Nahas et al. | 365/210 |
| 6,621,729 | B1 * | 9/2003 | Garni et al. | 365/158 |
| 2002/0006058 | A1 | 1/2002 | Nakajima et al. | |
| 2002/0054500 | A1 | 5/2002 | Yamada | |
| 2002/0140000 | A1 | 10/2002 | Watanabe | |
| 2002/0186582 | A1 | 12/2002 | Sharma et al. | |

FOREIGN PATENT DOCUMENTS

| EP | 1 406 266 A2 | 4/2004 |
|---|---|---|
| JP | A-2001-236781 | 8/2001 |
| JP | A-2001-266567 | 9/2001 |
| JP | A 2001-273759 | 10/2001 |
| JP | A 2002-170374 | 6/2002 |
| JP | A 2002-353415 | 12/2002 |

OTHER PUBLICATIONS

ISSCC 2000/Session 7/TD: Emerging Memory & Device Technologies/Paper TA7.2; pp. 128-129.

* cited by examiner

*Primary Examiner*—Anh Phung
(74) *Attorney, Agent, or Firm*—Oliff & Berridge, PLC

(57) ABSTRACT

A magnetic memory device and a sense amplifier circuit capable of obtaining a read signal output with a high S/N ratio and reducing power consumption and a circuit space, and a method of reading from a magnetic memory device are provided. In a sense amplifier, transistors (41A), (41B) which are differential amplifiers are commonly connected to one constant current circuit (50) through switches (46) ( . . . , 46n, 46n+1, . . . ). Corresponding bit decode lines (20) ( . . . , 20n, 20n+1, . . . ) and a read selection signal line (90) are connected to the switches (46) ( . . . , 46n, 46n+1, . . . ). A read/write signal is transferred from the read selection signal line (90), and the switches (46) operate according to a bit decode value and the read/write signal.

14 Claims, 22 Drawing Sheets

「0」　　　　　　　　　　　「1」

| TRANSISTOR 461 | TRANSISTOR 462 | SWITCH 46 |
|---|---|---|
| L | L | OFF |
| L | H | ON |
| H | L | OFF |
| H | H | OFF |

MAGNETIC MEMORY DEVICE, SENSE AMPLIFIER CIRCUIT AND METHOD OF READING FROM MAGNETIC MEMORY DEVICE

TECHNICAL FIELD

The present invention relates to a magnetic memory device using a magnetoresistive device, a sense amplifier circuit used to read information from a magnetic memory device, and a method of reading information in a magnetic memory device.

BACKGROUND ART

Conventionally, as general-purpose memories used in information processors such as computers or mobile communications devices, volatile memories such as DRAMs or SRAMs are used. Unless a current is continuously supplied to the volatile memories, the volatile memories lose all information. Therefore, it is necessary to provide non-volatile memories for storing information in addition to the volatile memories, and as the non-volatile memories, flash EEPROMs, hard disk drives and the like are used. As information processing becomes faster, an increase in speed of the non-volatile memories is an important issue. Moreover, in terms of the development of information devices for so-called ubiquitous computing in recent years, the development of high-speed non-volatile memories as key devices for ubiquitous computing has been strongly desired.

As an effective technique for increasing the speed of the non-volatile memory, an MRAM (Magnetic Random Access Memory) is known. In the MRAM, each of storage cells arranged in a matrix form includes a magnetic device. A currently practical MRAM uses a giant magneto-resistive effect (GMR). The GMR is a phenomenon that in a laminate in which two ferromagnetic layers are stacked so that the directions of the easy magnetization axes of the magnetic layers are parallel to each other, when the magnetization direction of each ferromagnetic layer is parallel to the easy magnetization axis, the resistance is minimum, and when the magnetization direction of each magnetic layer is antiparallel to the easy magnetization axis, the resistance is maximum. In an actual GMR device, each of two ferromagnetic layers includes a pinned layer of which the magnetization direction is pinned, and a free layer (a magnetic sensitive layer) of which the magnetization direction can be changed by an external magnetic field which are stacked with a non-magnetic layer in between. Each storage cell stores information of either of the two states corresponding to binary information "0" and "1", and detects a difference in resistance corresponding to information as a change in current or voltage so as to read information.

Moreover, in a magnetic device using a tunneling magneto-resistive effect (TMR), the MR ratio can be much larger than that in the GMR device. The TMR is a phenomenon that in a laminate including two ferromagnetic layers (a pinned layer of which the magnetization direction is pinned and a magnetic sensitive layer of which the magnetization direction is changeable, that is, a free layer) stacked with an extremely thin insulating layer in between, the value of a tunnel current flowing through the insulating layer changes according to a relative angle between the magnetization directions of the two ferromagnetic layers. In other words, in the case where the magnetization directions are parallel to each other, the tunnel current is maximum (the resistance of the device is minimum), and in the case where the magnetization directions are antiparallel to each other, the tunnel current is minimum (the resistance of the device is maximum). Thus, in a TMR-MRAM, writing of stored information is performed as in the case of the GMR-MRAM, and reading of information is performed by a method of detecting a difference between relative magnetization directions of the ferromagnetic layers (parallel or antiparallel) as a difference in an output current or cell resistance through flowing a current through the insulating layer in a perpendicular direction to a layer surface.

As a specific example of the TMR device, a laminate structure of CoFe/Al oxide/CoFe is known, and its MR ratio is 40% or more. Moreover, the TMR device has high resistance, so it is considered that the TMR device easily matches a semiconductor device such as a MOS field effect transistor (MOSFET: Metal-Oxide-Semiconductor Field Effect Transistor). Such advantages allow the TMR-MRAM to achieve a high output more easily than the GMR-MRAM, so improvements in the storage capacity and the access speed of the TMR-MRAM are expected.

As the cell array structure, a structure in which a plurality of TMR devices are connected in parallel on data lines, and a semiconductor device for selection is arranged corresponding to each of the TMR devices or each of the data lines has been proposed. Moreover, a structure in which the TMR devices are arranged in a matrix form through the use of row data lines and column data lines, and a transistor for selection is arranged for each data line has been proposed.

Among them, a structure in which a semiconductor device is arranged for each TMR device has the best characteristic in power consumption efficiency at the time of reading. However, in the case where variations in the characteristics of the semiconductor devices occur, noises due to the variations are not negligible. In addition, when noises relating to the data lines, noises due to variations in characteristics of a sense amplifier, and noises of peripheral circuits traveling through a power source circuit are considered, the S/N ratio of the output voltage of the storage cell may be only a few dB.

Therefore, in order to improve the S/N ratio of a read output, the cell array of the TMR-MRAM has been improved as below. A commonly used method is to compare an output voltage V of one selected storage cell to a reference voltage Vref, and differentially amplify a differential voltage Vsig. The purpose of differential amplification is firstly to eliminate noises generated in a data line pair to which the storage cell is connected, and secondly to eliminate the offset of an output voltage due to variations in characteristics of semiconductor devices for sense line drive or for cell selection. However, a circuit generating the reference voltage Vref includes a circuit using a dammy cell or a semiconductor device, and variations in device characteristics between the circuit and the storage cells occur, so it is impossible to completely eliminate the offset of the output voltage in principle.

As a technique for resolving this issue, a method of using a pair of TMR devices to form a storage cell, and differentially amplifying outputs from the pair of TMR devices is widely known. In the method, writing is performed so that the magnetization directions of the magnetic sensitive layers of the pair of TMR devices are always antiparallel to each other. In other words, writing is complementarily performed so that in one of the devices, the magnetization of the magnetic sensitive layer and the magnetization of the pinned layer are parallel to each other, and in the other device, they are antiparallel to each other, and the outputs from the two devices are differentially amplified to read information, thereby common mode noises are eliminated, and the S/N ratio is improved. The structure of such a differential amplification type circuit has been disclosed in Japanese Unexamined Patent Application Publication Nos. 2001-236781 and 2001-266567, ISSCC 2000 Digest paper TA7.2 or the like.

For example, in techniques described in Japanese Unexamined Patent Application Publication Nos. 2001-236781 and 2001-266567, a storage cell includes a first TMR device and a second TMR device, and an end of the first TMR device and an end of the second TMR device are separately connected to a pair of a first data line and a second data line, and the other ends of them are connected to a bit line through a common semiconductor device for cell selection. A word line is connected to the semiconductor device for cell selection. While the first data line and the second data line are maintained at the same potential, a potential difference is applied between the bit line and the first and the second data lines, and the difference value between currents flowing through the first and the second data lines is outputted, thereby information is read out.

However, in such a differential amplification system, in general, variations in resistance between a pair of TMR devices are an issue. The TMR devices have variations in resistance which are produced during a manufacturing process, and a current error due to the variations is inevitable. Therefore, the S/N ratio of an output signal inevitably declines.

Moreover, in the above-described wiring structure example, in order to obtain a stable read signal output, it is necessary to fully prevent variations in resistance between the TMR devices connected to the first line and the second line, and variations in characteristics between semiconductor devices for selection. However, in this case, a voltage difference at the same potential is applied to the first data line and the second data line, so a read current is changed depending upon the above-described variations. In other words, in the structure, the above-described variations cannot be prevented in principle, and there is an issue that it is extremely difficult to take all possible measures against noises due to the variations.

Therefore, in a conventional MRAM, the S/N ratio of the read signal is not sufficiently improved. As a result, although the MR ratio of the device reaches approximately 40%, in an actual TMR-MRAM, a sufficiently large signal output cannot be obtained. Thus, it is assumed that a present memory structure cannot sufficiently respond to a further increase in memory density in addition to having an issue of the structure in operation stability. Moreover, a reduction in power consumption or a reduction in the space of a drive circuit is also an important issue.

DISCLOSURE OF THE INVENTION

In view of the foregoing, it is an object of the invention to provide a magnetic memory device and a sense amplifier circuit capable of obtaining a read signal output with a high S/N ratio and reducing power consumption and a circuit space, and a method of reading from a magnetic memory device.

A magnetic memory device according to the invention includes a plurality of magnetoresistive devices each including a magnetic sensitive layer of which the magnetization direction changes by an external magnetic field, wherein one storage cell includes a pair of the magnetoresistive devices, and the magnetic memory device comprises: a read line pair supplying a read current to the pair of magnetoresistive devices; and a sense amplifier circuit reading information from the storage cell on the basis of a difference between a pair of read currents flowing through the read line pair, wherein the sense amplifier circuit includes: a differential switch pair being disposed for each read line pair; a bias resistor pair being disposed between each differential switch pair and a power source; and a constant current circuit being shared among a plurality of the differential switch pairs, and making the sum of a pair of read currents flowing through each differential switch pair constant.

In the magnetic memory device according to the invention, "connected" means the state of being connected at least electrically, and does not always mean the state of being connected directly and physically. Moreover, in the invention, "a power source" is a supply source of a current or a voltage necessary for circuit operation, and means an internal power source line of the magnetic memory device. Further, "a differential switch pair" includes not only switch devices performing a differential operation establishing, for example, an perfect on-off relationship between the switch devices in which a current of 160 μA flows through one switch device, and no current flows through the other switch device, but also switch devices performing a differential operation in two relative states occurring during operation, that is, in a middle state in which a larger current flows through one switch device and a smaller current flows through the other switch device, for example, a current of 110 μA flows through one switch device, and a current of 50 μA flows through the other switch device.

In the magnetic memory device, a pair of read currents of which the sum is always constant is supplied to a pair of magnetoresistive device constituting a storage cell, and information is read out from the storage cell on the basis of a difference between the read currents. In this system, the read currents are differentially outputted, so noises generated in the read lines, or offset components included in the output values of the magnetoresistive devices balance each other out. At this time, a difference between the read currents is differentially amplified as a voltage difference by the sense amplifier circuit. A plurality of sense amplifier circuits are disposed for each read line pair in a portion including the differential switch pair and the bias resistor pair, and the constant current circuit for making the sum of the read currents constant is shared among the plurality of sense amplifier circuits, so variations in a sense amplifier output due to variations in the characteristics of the constant current circuit can be prevented.

More specifically, the magnetic memory device preferably includes a current-voltage conversion resistor pair between the read line pair and the power source, wherein terminals of the current-voltage conversion resistor pair on a side opposite to a side closer to the power source are connected to the differential switch pair of the sense amplifier circuit. The read current supplying to each of a pair of read lines from the power source is taken out as a voltage output by voltage drops across the current-voltage conversion resistor pair, and is inputted into the sense amplifier circuit. In order to obtain a large output value, the current-voltage conversion resistor preferably has a larger resistance than the resistance of the magnetoresistive device.

Moreover, in the sense amplifier circuit, a first switch which is disposed between each of a plurality of the differential switch pairs and the constant current circuit, and selects one among the plurality of differential switch pairs, and a pair of second switches which is disposed between the power source and the read line pair, and selects whether or not to supply a read current to the read line pair are preferably included. In other words, only in the sense amplifier circuit selected by the first switch, conduction between the differential switch device and the constant current circuit is provided so that the sense amplifier circuit can operate, and a read current is supplied only to the read line pair selected by the pair of second switches. When switching of the first and the second switches is controlled by a first selection signal for selecting one among the plurality of differential switch pairs, a bit array including a storage cell targeted for reading is selected, and the sense amplifier circuit corresponding to the selected bit array is selected as a target for operation. Moreover, when switching of the first switch is controlled by a first selection signal for selecting one among the plurality of differential switch pairs and a second selection signal indicating a read mode, and switching of the second switches is controlled by the first selection signal, information is controlled so as to be outputted only in a read mode, and not to be outputted in a write mode.

The constant current circuit can use a bandgap reference, and can include, for example, a current limiting transistor, a diode being connected between the base of the current limiting transistor and the ground, and a current controlling resistor being connected between the emitter of the current limiting transistor and the ground.

In the constant current circuit with such a structure, when the base of the transistor is connected to a constant current circuit control terminal to which a control signal at a voltage level at which the transistor can be brought into a cutoff state, all sense amplifier circuits among which the constant current circuit is shared can be controlled to be in either of an active state or an inactive (standby) state by a control signal inputted into the constant current circuit control terminal. The standby mode in this case means not a state in which the operation of a circuit system is completely stopped, but a suspending state in which the operation of the circuit system does not operate until next time the circuit system is selected.

Preferably, the bias resistor pair can be also shared among a plurality of the differential switch pairs, and in this case, because an influence of variations in the characteristics of the bias resistor pair is eliminated from the sense amplifier output.

Moreover, in the magnetic memory device, the pair of second switches, the current-voltage conversion resistor pair and the differential switch pair are preferably packed in the same region. In other words, the pair of second switches and the current-voltage conversion resistor pair are formed in a region where the sense amplifier circuit is formed. Thereby, each of the device pairs is disposed closely, so a temperature change during a drive is substantially the same, thereby the characteristic values of the pair can be prevented from differing from each other. Further, the pair of second switches, the current-voltage conversion resistor pair and the differential switch pair each preferably have a symmetric circuit structure, because an appropriate differential output can be obtained. In this case, "symmetric" means that electrical characteristics of the pair of devices among devices constituting a circuit are substantially the same.

Preferably, such a magnetic memory device includes a plurality of first write lines; and a plurality of second write lines extending so as to intersect with the plurality of first write lines, wherein each of the plurality of magnetoresistive devices includes: a laminate which includes the magnetic sensitive layer and through which a current flows in a direction perpendicular to a laminate surface; and a toroidal magnetic layer which is disposed on one surface of the laminate so that its direction along the laminate surface is its axial direction, and the first and the second write lines pass through the toroidal magnetic layer. In this case, "toroidal" in the "toroidal magnetic layer" shows a state where the toroidal magnetic layer is magnetically and electrically continuous to completely surround the first and the second write lines passing through the interior of the toroidal magnetic layer, and the sectional surface of the toroidal magnetic layer in a direction across the first or the second write line is closed. Therefore, the toroidal magnetic layer is allowed to include an insulator as long as it is magnetically and electrically continuous, and may include an oxide film to an extent in which the formation of the oxide film occurs in a manufacturing process. Further, "an axial direction" indicates an opening direction when attention is given to the toroidal magnetic layer, that is, an extending direction of the first and the second write lines passing through the interior of the toroidal magnetic layer. Moreover, "disposed on one surface of the laminate" included not only the case where the toroidal magnetic layer is disposed as a separate body from the laminate on one surface of the laminate, but also the case where the toroidal magnetic layer is disposed so as to include a part of the laminate.

Information is written into each magnetoresistive device by a magnetic field generated by currents flowing through the first and the second write lines passing through the toroidal magnetic layer. At this time, a closed magnetic path is formed in the toroidal magnetic layer through flowing a current through the write line, so the magnetization of the magnetic sensitive layer is efficiently reversed, and information is reliably written. A larger signal output can be obtained from information written in such a manner at the time of reading. In this case, when the magnetic sensitive layer and the toroidal magnetic layer are electrically connected to each other, the read current flowing through the magnetic sensitive layer flows to the read line through the toroidal magnetic layer, so the first and the second write lines can be disposed near the magnetic sensitive layer. In this case, the magnitude of the write current flowing through the write line can be reduced, thereby writing is efficiently performed.

It is preferable that in the magnetic memory device, the magnetization directions of magnetic sensitive layers in the pair of magnetoresistive devices are changed by a magnetic field which is induced by a current flowing through the first and the second write lines so as to be antiparallel to each other, thereby information is stored in the storage cell. At this time, when either of a pair of magnetoresistive devices is in a low resistance state, the other magnetoresistive device is brought into a high resistance state, and binary information corresponds to these two states. The stored information is read out from a storage cell on the basis of a difference between read currents flowing through the pair of magnetoresistive devices. In the invention, "the magnetizations are antiparallel to each other" includes the case where an angle between the magnetization directions, that is, average magnetizations in the magnetic layers is strictly 180 degrees, and the case where an angle between the magnetizations is deviated by a predetermined angle from 180 degrees due to an error generated during manufacturing or an error because the magnetic layers are not perfectly uniaxial.

Moreover, a sense amplifier circuit according to the invention is applied to a magnetic memory device, and the magnetic memory device includes a plurality of magnetoresistive devices including a magnetic sensitive layer of which the magnetization direction changes by an external magnetic field, and a read line pair supplying a read current to a pair of the magnetoresistive device, wherein one storage cell includes a pair of the magnetoresistive devices, and the sense amplifier circuit includes: a differential switch pair being disposed for each read line pair; a bias resistor pair being disposed between each differential switch pair and a power source; and a constant current circuit being shared among a plurality of the differential switch pairs, wherein information is read from the storage cell on the basis of a difference between a pair of read currents flowing through the read line pair.

In the sense amplifier circuit according to the invention, a difference between read currents is differentially amplified as a voltage difference, and at this time, the constant current circuit which is shared among a plurality of sense amplifiers makes the sum of the read currents constant. Therefore, variations in output due to variations in the constant current circuit can be prevented.

Moreover, a method of reading from a magnetic memory device according to the invention is applied to a magnetic memory device, and the magnetic memory device includes a plurality of magnetoresistive devices each including a magnetic sensitive layer of which the magnetization direction changes by an external magnetic field, and a read line pair supplying a read current to a pair of the magnetoresistive devices, wherein one storage cell includes a pair of the magnetoresistive devices, and the method comprises the steps of: arranging a differential switch pair for each read line pair; arranging a bias resistor pair between each differential switch pair and a power source; arranging a constant current circuit so as to be shared among a plurality of differential switch pairs; and reading information from the storage cell on the basis of a difference between a pair of read currents flowing through the read line pair.

The method of reading from a magnetic memory device according to the invention is to read information from the magnetic memory device according to the invention, and a read current is differentially outputted, and noises generated in the read lines or offset components included in the output values of the magnetoresistive devices are eliminated. At this time, a difference between read currents is differentially amplified as a voltage difference by the differential switch pair, and the sum of the read currents is made constant by the constant current circuit shared among a plurality of differential switch pairs, thereby variations in output due to variations in characteristics of the constant current circuit can be prevented.

BEST MODE FOR CARRYING OUT THE INVENTION

Preferred embodiments of the present invention will be described in more detail below referring to the accompanying drawings. As characteristics of a magnetic memory device according to the invention, (1) a readout circuit system adopts a differential read mode, and (2) each sense amplifier circuit differentially amplifying a read current commonly uses a constant current circuit which is a part of the sense amplifier circuit. In a first embodiment, the structure of a basic readout circuit system having the characteristic (1) will be described below. Several techniques for improving the S/N ratio of a read signal will be described below. Next, in a second embodiment, the characteristic (2) will be described.

First Embodiment

Figure 1:
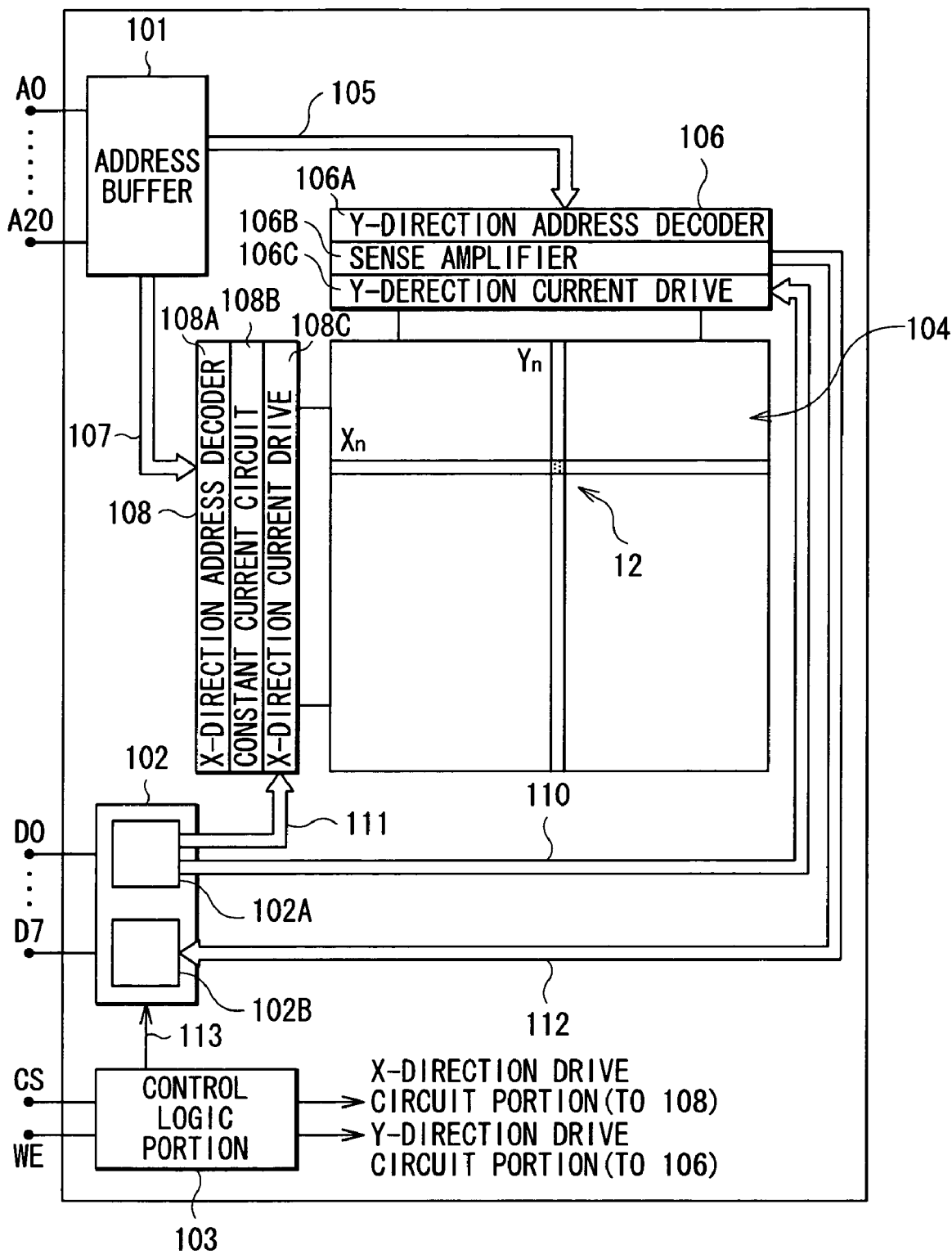
FIG. 1 is a block diagram of the whole structure of a magnetic memory device according to a first embodiment of the invention.

FIG. 1 is an illustration showing the whole structure of a magnetic memory device according to the first embodiment of the invention. The magnetic memory device is an MRAM embodied as a so-called semiconductor memory chip, and includes an address buffer 101, a data buffer 102, a control logic portion 103, a storage cell group 104, a Y-direction drive circuit portion 106 and an X-direction drive circuit portion 108 as main components. In this case, in the magnetic memory device, the storage cell group 104 is disposed in a wide region in the center of a silicon chip, and circuit components such as the drive circuit portions 106 and 108 or wires are arranged in a small region around the wide region.

In the storage cell group 104, a large number of storage cells 12 are arranged in a word line direction (an X direction) and a bit line direction (a Y direction) in a matrix form as a whole. Each storage cell 12 is a minimum unit for storing data, and the storage cell 12 stores bit data "1" or "0". In the description, each row and each column of the storage cells 12 in the storage cell group 104 are called a word array Xn and a bit array Yn, respectively.

The Y-direction drive circuit portion 106 includes a Y-direction address decoder 106A, a sense amplifier 106B for reading and a Y-direction current drive 106C for writing, each of which is connected to each bit array Yn (Y1, Y2, . . . ) of the storage cells 12 in the storage cell group 104.

The X-direction drive circuit portion 108 includes an X-direction address decoder 108A, a constant current circuit 108B for reading and an X-direction current drive 108C for writing, each of which is connected to each word array Xn (X1, X2, . . . ) of the storage cells in the storage cell group 104. Therefore, for example, as shown in the drawing, one storage cell 12 is uniquely selected by an address (Xn, Yn) in a word direction and a bit direction inputted from the X-direction address decoder 108A and the Y-direction address decoder 106A.

The address buffer 101 includes external address input terminals A0 through A20, and is connected to the Y-direction address decoder 106A and the X-direction address decoder 108A through address lines 105 and 107. The address buffer 101 has a function of taking a selection signal for selecting the storage cell 12 from the external address input terminals A0 through A20 to amplify the signal to a voltage level necessary in the address decoders 106A and 108A by an internal buffer amplifier. Moreover, the amplified selection signal is divided into two selection signals in the word line direction (X direction) and the bit line direction (Y direction) of the storage cell 12, and the two selection signals are inputted into the address decoders 106A and 108A, respectively. In the case where the magnetic memory device includes a plurality of storage cell groups 104, an address signal for selecting one storage cell group 104 among the plurality of storage cell groups 104 is inputted into the address buffer 101.

The data buffer 102 includes external data terminals D0 through D7 for exchanging a digital data signal with an external component, and is connected to a control logic portion 103 through a control signal line 113. The data buffer 102 includes an input buffer 102A and an output buffer 102B, and the input buffer 102A and the output buffer 102B are activated by a control signal from the control logic portion 103. The input buffer 102 is connected to the Y-direction current drive 106C and the X-direction current drive 108C through write data buses 110 and 111, and the input buffer 102 has a function of taking a data signal from the external data terminals D0 through D7 at the time of memory writing to amplify the data signal to a necessary voltage level by the internal buffer amplifier, and then outputting the amplified data signal to the current drives 106C and 108C. The output buffer 102B is connected to the sense amplifier 106B through a read data bus 112, and has a function of outputting a read data signal inputted from the sense amplifier 106B at the time of memory reading to the external data terminals D0 through D7 at low impedance through the use of the internal buffer amplifier.

The control logic portion 103 includes an input terminal CS and an input terminal WE, and is connected to the data buffer 102 through the control signal line 113. The control logic portion 103 controls the operation of the storage cell group 104, and a signal (a chip select; CS) indicating whether or not to make the write/read operation of the magnetic memory device active is inputted into the control logic portion 103 from the input terminal CS. Moreover, a write enable signal (write enable; WE) for switching between the write operation and the read operation is inputted into the control logic portion 103 from the input terminal WE. The control logic portion 103 has a function of amplifying a signal voltage inputted from the input terminal CS and the input terminal WE to a voltage level necessary in the drive circuit portions 106 and 108 by the internal buffer amplifier.

[Structure of Readout Circuit]

Next, the structure of a readout circuit of the magnetic memory device will be described below.

Figure 2:
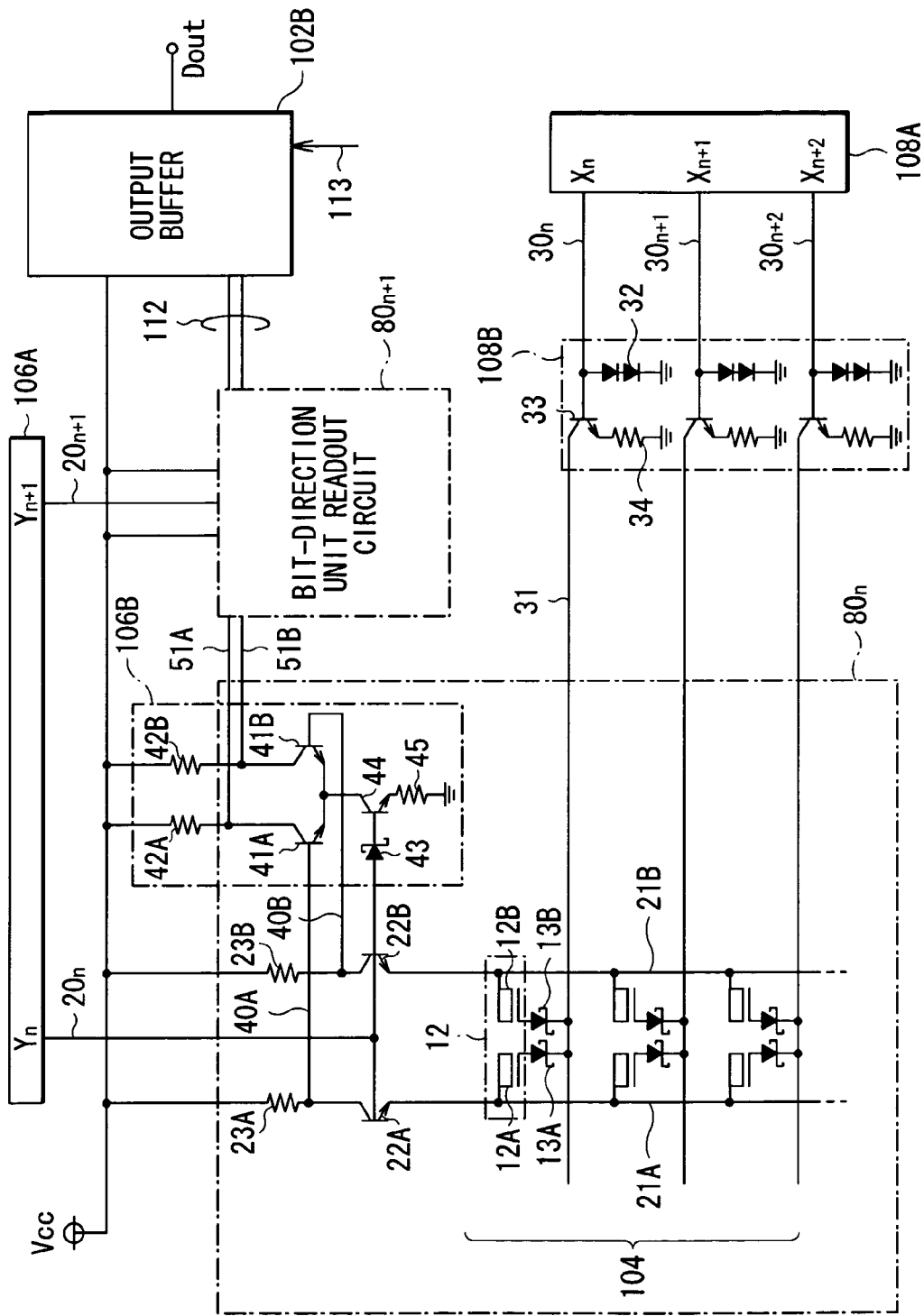
FIG. 2 is an illustration showing the structure of a storage cell of the magnetic memory device shown in FIG. 1 and a readout circuit.

FIG. 2 is a block diagram of a circuit system including a storage cell group and the readout circuit. The readout circuit system is a differential amplification type in which the storage cell 12 includes a pair of magnetoresistive devices 12A and 12B. In this case, the information of each storage cell 12 is read out through outputting a difference value between sensing currents flowing into the magnetoresistive devices 12A and 12B (currents flowing into the magnetoresistive devices 12A and 12B from sense bit decode lines 21A and 21B and flowing out to a common sense word decode line 31).

In the drawing, the storage cells 12 in each bit array Yn of the storage cell group 104 and a part of the readout circuit including the sense amplifier 106B constitute a bit direction unit readout circuit 80 ( . . . , 80n, 80n+1, . . . ) which is a repeating unit of the readout circuit, and the bit direction unit readout circuit 80 is aligned in parallel to a bit array direction. Each bit direction unit readout circuit 80 ( . . . , 80n, 80n+1, . . . ) is connected to a Y-direction address decoder 106A through the bit decode line 20 ( . . . , 20n, 20n+1, . . . ), and is connected to the output buffer 102B through the read data bus 112. In the drawing, all bit direction unit readout circuits 80 are not shown because of a lack of space, so only two arrays of the bit direction unit readout circuits 80 are shown. Further, as in the case of the bit direction unit readout circuits 80, only two arrays Yn and Yn+1 of the storage cell group 104 are shown.

The magnetoresistive devices 12A and 12B of each storage cell 12 are magnetoresistive devices using GMR or TMR. As a specific example, the case where the magnetoresistive devices 12A and 12B are TMR devices will be described later.

In the storage cell group 104, wiring is carried out in a matrix form with a sense word decode line 31 (hereinafter referred to as a sense word line) aligned in an X direction and a pair of sense bit decode lines 21A and 21B (hereinafter referred to as sense bit lines) aligned in a Y direction. Each storage cell 12 is disposed in a position where the sense word line 31 and the sense bit lines 21A and 21B intersect with each other, and the storage cells 12 which are connected in parallel by the common sense bit lines 21A and 21B forms a bit array Yn, and the storage cells 12 which are cascaded by the common sense word line 31 forms a word array Xn.

In one storage cell 12, an end of the magnetoresistive device 12A and an end of the magnetoresistive device 12B are connected to the sense bit lines 21A and 21B, and the other end of the magnetoresistive device 12A and the other end of the magnetoresistive device 12B are connected to the common sense word line 31 through a pair of backflow prevention diodes 13A and 13B. In this case, the current path of a sensing current through each of the magnetoresistive devices 12A and 12B is from a node between a wire from each device and each of the sense bit lines 21A and 21B to a node between a wire from each device to the sense word line 31. The sense bit lines 21A and 21B correspond to "a pair of read lines" in the invention.

(Connection in Bit Array Direction)

The sense bit lines 21A and 21B are arranged in a pair for each bit array Yn (Y1, Y2, . . . ) of the storage cells 12. The sense bit lines 21A and 21B extend in a Y direction so as to pass through the storage cell group 104, and an end of each of the sense bit lines 21A and 21B is connected to a power source Vcc. Current-voltage conversion resistors 23A and 23B and the collector-emitters of transistors 22A and 22B are connected in series to ends of the sense bit lines 21A and 21B (on a side closer to the power source Vcc), respectively. A plurality of storage cells 12 constituting the bit array Yn are connected to the sense bit line 21A and the sense bit line 21B. More specifically, an end of the magnetoresistive device 12A in the storage cell 12 is connected to the sense bit line 21A, and an end of magnetoresistive device 12B is connected to the sense bit line 21B.

Moreover, the bit decode line 20 is connected to the bases of the transistors 22A and 22B. The bit decode line 20 is connected to the Y-direction address decoder 106A, and a selection signal selectively outputted from the Y-direction address decoder 106A is inputted into the bit array Yn to which a storage cell 12 targeted for writing/reading belongs. In other words, the bit decode line 20 ( . . . , 20n, 20n+1, . . . ) is disposed corresponding to each bit array Yn of the storage cells 12, and has a function of sending a selection signal from the Y-direction address decoder 106A to a target bit array Yn. The transistors 22A and 22B have a function of switching according to the value of the selection signal (a bit decode value) inputted from the bit decode line 20 as a pair of second semiconductor switches.

Although the bit decode line 20 and the sense bit lines 21A and 21B have the same decoding function, they are clearly differentiated from each other in terms of operation. More specifically, the bit decode line 20 is a signal line through which a signal indicating a selected cell is transferred from the Y-direction address decoder 106A, and the value of the signal is a binary digital signal "High" or "Low". On the other hand, the sense bit lines 21A and 21B are analog signal lines for detecting a weak current flowing into the magnetoresistive devices 12A and 12B. The same holds true for a word decode line 30 and a sense word line 31.

Moreover, sense amplifier input lines 40A and 40B (hereinafter referred to as input lines 40A and 40B) are drawn from nodes at ends of the current-voltage conversion resistors 23A and 23B connected to the sense bit lines 21A and 21B on a side opposite to a side closer to the power source Vcc. The current-voltage conversion resistors 23A and 23B function as bias resistors of the sense amplifier 106B. In other words, the current-voltage conversion resistors 23A and 23B are disposed to convert sensing currents flowing from the power source Vcc to the sense bit lines 21A and 21B into voltages by voltage drops across the resistors 23A and 23B, and then send the voltages to the sense amplifier 106B through the input lines 40A and 40B. The current-voltage conversion resistors 23A and 23B also have a function of producing a intermediate voltage level which is $-\phi$ lower than the supply voltage of the power source Vcc. In this case, the sensing currents are weak, so in order to increase a voltage value to be inputted into the input lines 40A and 40B as large as possible through obtaining large voltage drops across the current-voltage conversion resistors 23A and 23B, it is necessary to increase the resistance values of the current-voltage conversion resistors 23A and 23B. Therefore, for example, the current-voltage conversion resistors 23A and 23B preferably have a high resistance of approximately 100 k$\Omega$, and the current-voltage conversion resistors 23A and 23B preferably have at least a resistance larger than the resistance of the magnetoresistive devices 12A and 12B.

(Connection in a Word Array Direction)

Storage cells 12 arranged in the same word array Xn (X1, X2, . . . ) are connected to each sense word line 31. However, in the embodiment, backflow prevention diodes 13A and 13B as rectifying devices are disposed between the storage cell 12 and the sense word line 31. The backflow prevention diodes 13A and 13B correspond to and are connected to the magnetoresistive devices 12A and 12B, respectively. Moreover, the magnetoresistive device 12A and the backflow prevention diode 13A, and the magnetoresistive device 12B and the backflow prevention diode 13B are insulated from each other.

The backflow prevention diode 13 is disposed as a one-direction device for preventing a current from flowing back from the sense word line 31 to each of the magnetoresistive devices 12A and 12B. As the backflow prevention diode 13, for example, a pn-junction diode, a Schottky diode, a diode formed by a short circuit between the base and the collector of a bipolar junction transistor (BJT), or a diode formed by a short circuit between the gate and the drain of a MOSFET can be used.

Moreover, the ground side of the sense word line 31 is connected between collector and the emitter of the transistor 33, and the word decode line 30 ( . . . , 30n, 30n+1, . . . ) is disposed on the base side of the transistor 33 so as to correspond to the word array Xn. The word decode line 30 is connected to the X-direction address decoder 108A, and a selection signal which selects the word array Xn is inputted into the word decode line 30 from the X-direction address decoder 108A, and the word decode line 30 has a function of sending the selection signal to the base side of the transistor 33.

The transistor 33 functions as a first semiconductor switch which opens or closes according the value of a selection signal (a bit decode value) inputted into the base, and controls conduction/cutoff of the sense word line 31. As the transistor 33, for example, a BJT or a MOSFET can be used. A current controlling resistor 34 is disposed on the emitter side of the transistor 33.

In the embodiment, a constant current circuit 108B is further disposed on the ground side of the sense word line 31. The constant current circuit 108B has a function of making a current flowing through the sense word line 31 constant, and includes a constant voltage generation diode 32, the transistor 33 and the current controlling resistor 34. Therefore, the transistor 33 has a function of flowing a constant current between the collector and the emitter in addition to a function as a word decode semiconductor switch, and the base side of the resister 33 is connected to the anode of the diode 32. In this case, the diode 32 includes two diodes connected in series.

(Circuit Structure of Sense Amplifier)

One sense amplifier 106B is disposed in each bit direction unit readout circuit 80, and has a function of taking a potential difference between one pair of the sense bit lines 21A and 21B in each bit direction unit readout circuit 80 to amplify the potential difference. The sense amplifier 106B in each bit direction unit readout circuit 80 is connected to corresponding sense bit lines 21A and 21B through the input lines 40A and 40B, and all sense amplifiers 106B are connected to common sense amplifier output lines 51A and 51B (hereinafter referred to output lines 51A and 51B), and are finally connected to an output buffer 102B through the read data bus 112.

The sense amplifier 106B is a so-called differential amplifier, and includes an amplification stage including transistors 41A and 41B, bias resistors 42A and 42B as bias resistors for taking a voltage output, a diode 43 for a voltage drop, a transistor 44 having a current limiting function and a selection switching function, and a resistor 45 for a voltage drop.

Figure 3:
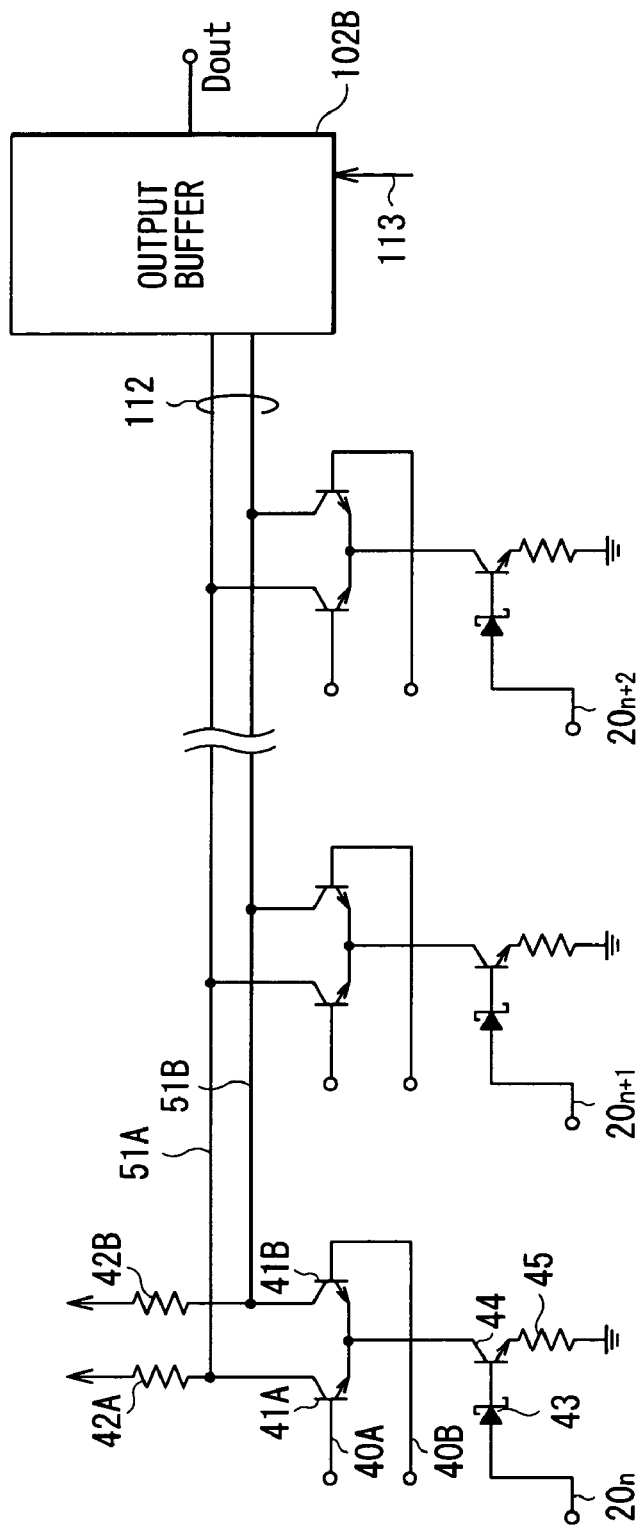
FIG. 3 is a circuit diagram for describing the structure of the whole sense amplifier in the readout circuit shown in FIG. 2.

FIG. 3 shows the sense amplifier 106B of the readout circuit. As shown in the drawing, the sense amplifier 106B disposed in each bit direction unit readout circuit 80 is cascaded through the output lines 51A and 51B. Moreover, the bias resistors 42A and 42B are shared among all cascaded sense amplifiers 106B. Further, the output lines 51A and 51B are replaced with the read data bus 112 in an output final stage, and are connected to the output buffer 102B.

The input lines 40A and 40B are connected to the base sides of the transistors 41A and 41B, and the bias resistors 42A and 42B are connected to on the collector sides of the transistors 41A and 41B through the output lines 51A and 51B. Moreover, the emitter sides of the transistors 41A and 41B is connected to the collector side of the transistor 44. The transistor 44 has a current limiting function and a function as a semiconductor switch which opens and closes according to the bit decode value from the bit decode line 20, and the bit decode line 20 is connected to the base side of the transistor 44 through the diode 43, and the emitter side of the transistor 44 is grounded through the resistor 45. The diode 43 is used to produce a intermediate voltage level which is only −φ lower than the voltage level of the bit decode line 20 through the use of the bandgap reference, and then use the voltage value as an input voltage on the base side of the transistor 44.

In this case, in order to prevent variations in output signal values taken out from the output lines 51A and 51B, bias resistors with an accurately uniform resistance value is preferably used as the bias resistors 42A and 42B. It is important that the transistors 41A and 41B have uniform characteristics. Moreover, it is necessary to equalize the characteristics of the diode 43, the transistor 44 and the resistor 45 between the sense amplifiers 106B. The bit decode value as a constant voltage is inputted into the base of the transistor 44, so a current flowing into the resistor 45 through the collector-emitter of the transistor 44 is limited to a constant value. Therefore, the sum of currents flowing through the transistors 41A and 41B are constant, and a differential output is directly normalized. Therefore, in order to equalize a standard current value of each the sense amplifier 106B and prevent variations in the output signal values, it is preferable to equalize the above characteristics.

Next, referring to FIGS. 4 through 6, the circuit layout pattern of the magnetic memory device according to the embodiment will be described below.

Figure 4:
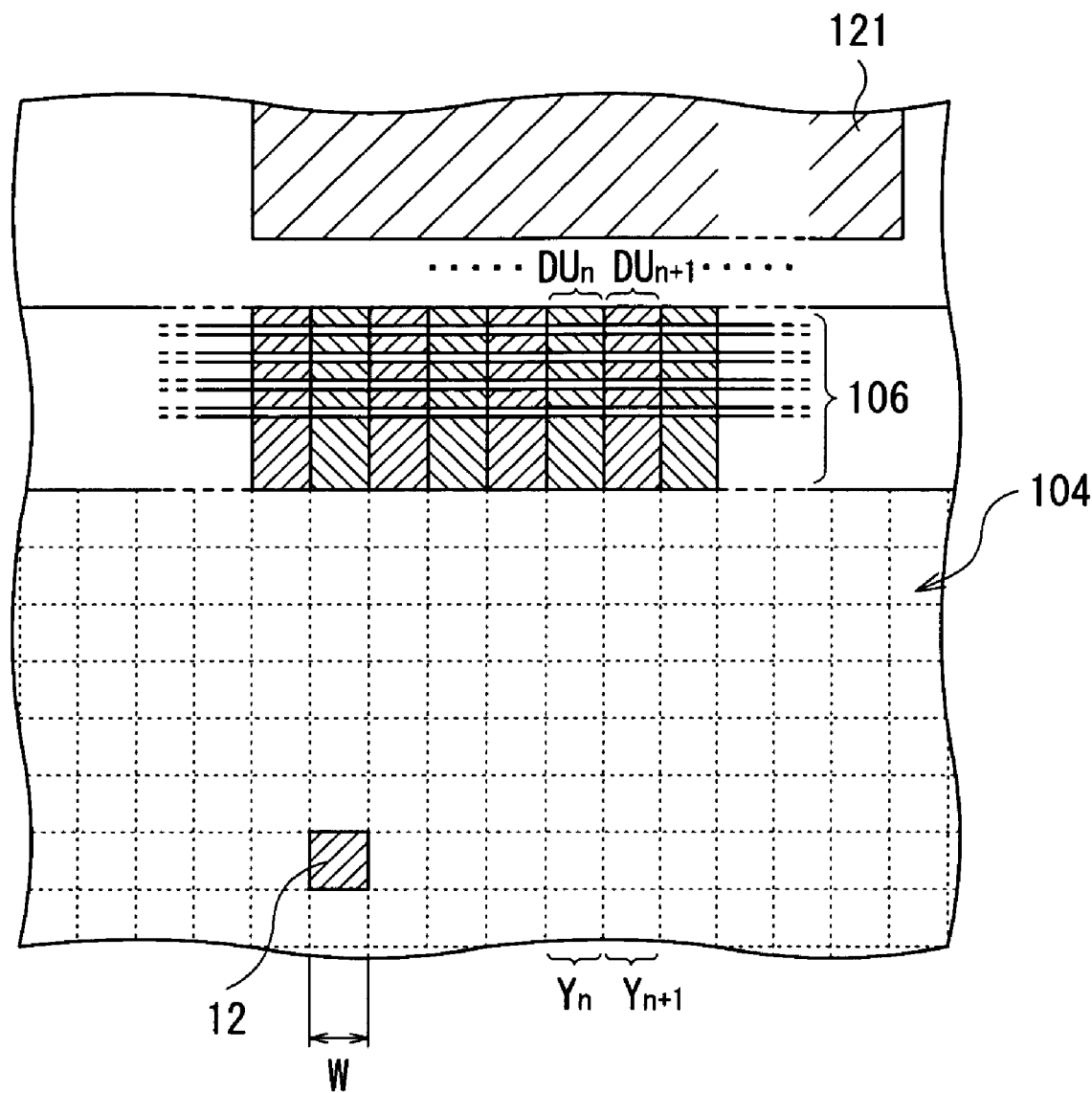
FIG. 4 is a structural diagram showing a packing state of a storage cell group shown in FIG. 1 around a Y-direction drive circuit portion.
Figure 5:
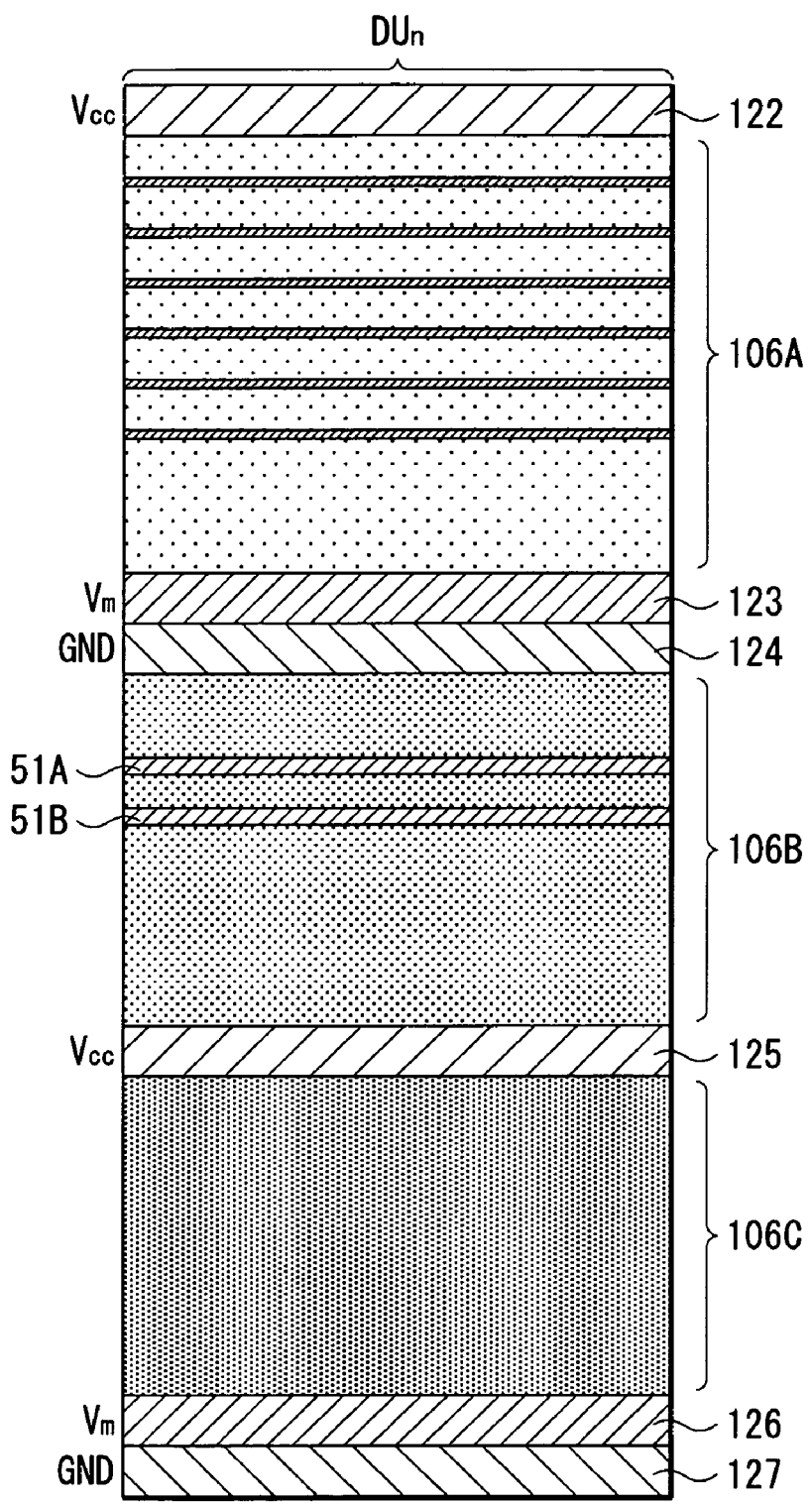
FIG. 5 is an illustration showing an actual circuit layout of the Y-direction drive circuit portion shown in FIG. 4.

FIG. 4 shows a packaging state of the storage cell group around the Y-direction drive circuit portion, and FIG. 5 shows an actual circuit layout of the Y-direction drive circuit portion. The Y-direction drive circuit portion 106 is formed on a side of the storage cell group 104, and a bonding pad 121 is disposed on the top side of the Y-direction drive circuit portion 106. In the Y-direction drive circuit portion 106, as described above, the Y-direction address decoder 106A, the sense amplifier 106B and the Y-direction current drive 106C each are established as one unit corresponding to each bit array Yn (Y1, Y2, . . . ). In the embodiment, one unit of the circuit 106A, one unit of the circuit 106B and one unit of the circuit 106C corresponding bit array Yn (Y1, Y2, . . . ) make up a unit drive circuit DUn (DU1, DU2, . . . ), and the unit drive circuit DUn is formed so that its width falls in the width W of the storage cell 12, thereby the unit drive circuit DUn is disposed an end portion of the corresponding bit array Yn.

FIG. 5 shows one unit drive circuit. The circuit area of the Y-direction address decoder 106A is formed between a power source line 122 (Vcc), a midpoint potential power source line 123 (Vm) and a ground line 124 (GND). The midpoint potential power source line 123 is a voltage source which supplies a voltage corresponding to a bandgap of +2 Φ to a current limiting transistor or the constant current circuit 108B in an X direction. Moreover, an address line 105 extends so as to pass across the circuit area, and the address decoder 106A of each unit drive circuit DUn is connected to the address line 105.

The circuit area of the sense amplifier 106B is formed between a power source line 125, the midpoint potential power source line 123 and the ground line 124. In the area, the output lines 51A and 51B extend so as to pass across the area, and the sense amplifier 106B of each unit drive circuit DUn is cascaded to the output lines 51A and 51B. The circuit area of the Y-direction current drive 106C is formed between the power source line 125, a midpoint potential power source line 126 and a ground line 127.

Figure 6:
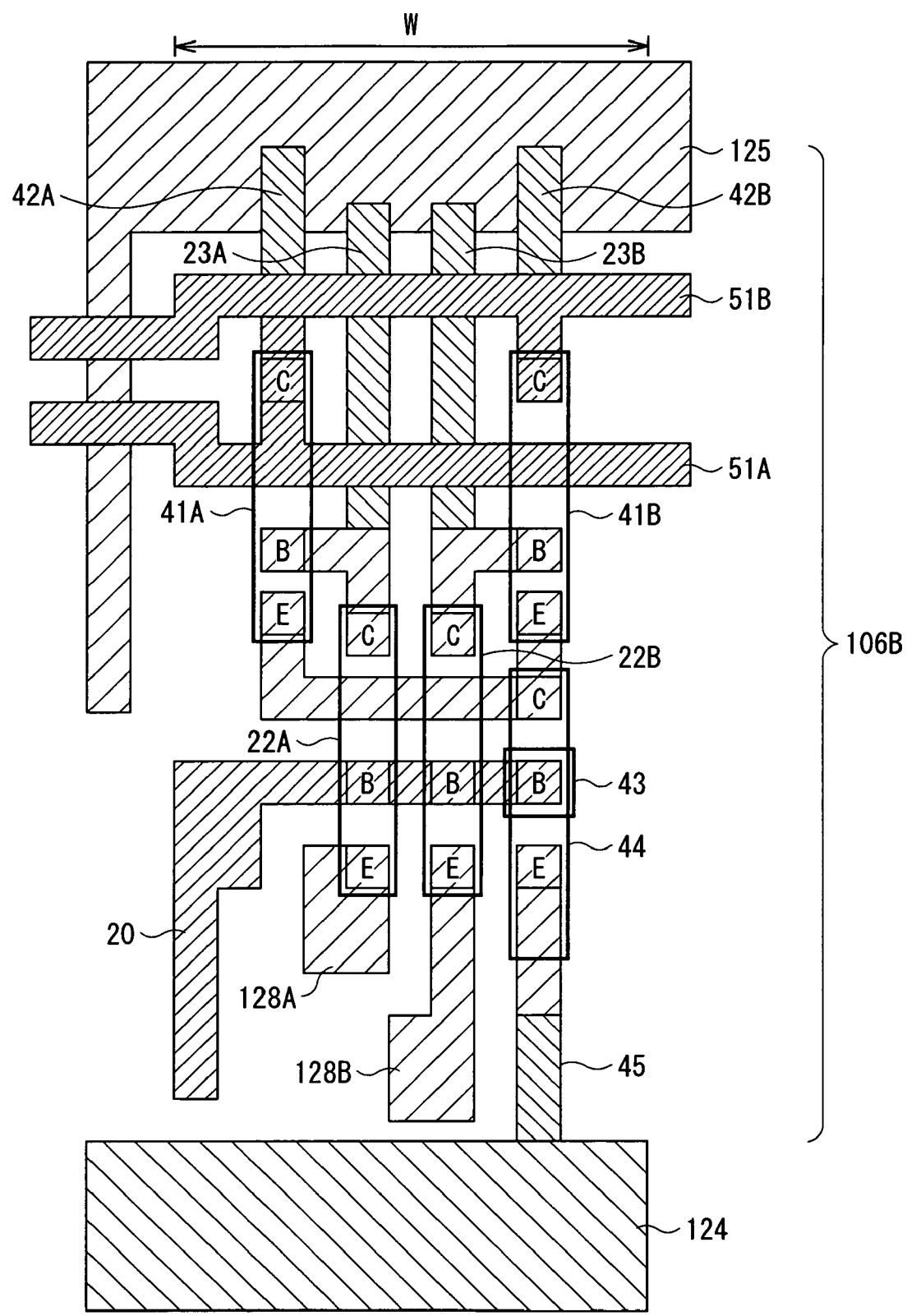
FIG. 6 is a pattern layout diagram of a sense amplifier circuit area in a unit drive circuit shown in FIG. 5.

FIG. 6 specifically shows the circuit pattern layout of only the sense amplifier in the unit drive circuit. As described above in FIG. 2, the sense amplifier 106B corresponds to each bit array Yn (Y1, Y2, . . . ), and is connected to the power source Vcc side of the sense bit lines 21A and 21B. Therefore, in this case, the transistors 22A and 22B, and the current-voltage conversion resistors 23A and 23B are packed together with the sense amplifier 106B in the circuit area of the sense amplifier 106B.

As can be seen from the circuit pattern layout diagram and the circuit diagrams of FIGS. 2 and 3, the transistors 22A and 22B, and the current-voltage conversion resistors 23A and 23B are arranged in pairs inside a pair of transistors 41A and 41B in the sense amplifier 106B. In this case, via pads 128A and 128B are connected to the sense bit lines 21A and 21B, respectively. The bit decode line 20 passes through the ground line 124 and is connected to the Y-direction address decoder 106A, although it is not shown in FIG. 6. In order to aid the understanding, in FIG. 6, the power source line 125 is disposed above, and the ground line 124 is disposed below by design so that FIG. 6 corresponds to FIGS. 2 and 3 but not FIG. 5.

A pair of transistors 22A and 22B, a pair of current-voltage conversion resistors 23A and 23B and the sense amplifiers 106B are all differential pairs, and it is important in operation that the pairs have uniform characteristics. Therefore, the characteristics are supposed to be uniform in advance; however, in the case where the temperature condition in the position of each circuit device is different, output characteristics may be different. On the other hand, in the embodiment, the above pairs of circuit devices are disposed closely, so they undergo the same temperature change, so the characteristics are changed in a like manner, so little difference arises. Thereby, a change in the output value due to a change in temperature can be reduced.

(Structure of Storage Cell)

Next, the structures of the magnetoresistive devices 12A and 12B used in the embodiment and the storage cell 12 will be described below.

Figure 7:
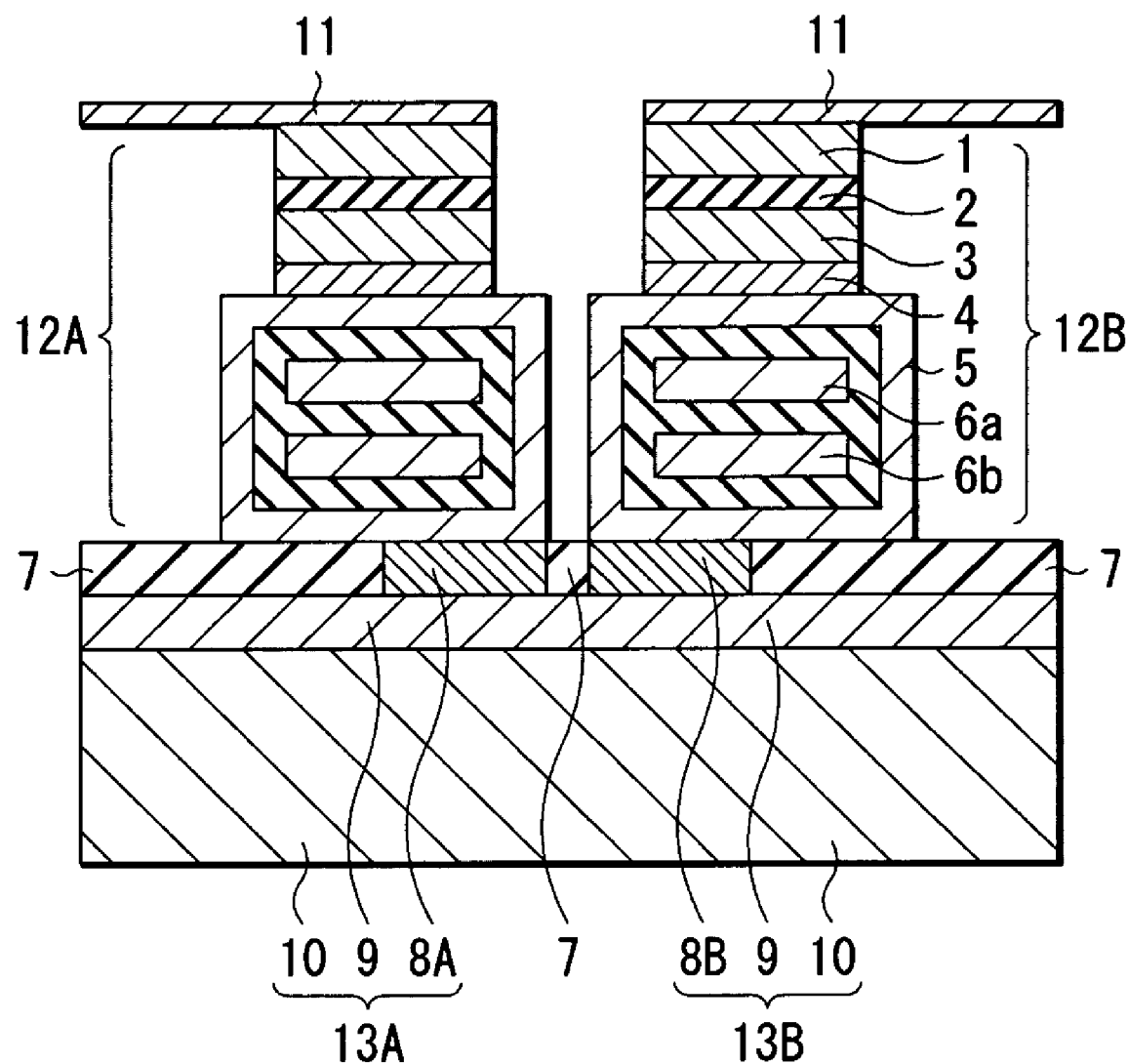
FIG. 7 is a sectional view of a specific structure of the storage cell shown in FIG. 1.

FIG. 7 is a sectional view of the structure of the storage cell. As shown in FIG. 7, the storage cell 12 includes a symmetrical pair of magnetoresistive devices 12A and 12B mounted on a substrate 10. The magnetoresistive devices 12A and 12B each have a laminate in which a first magnetic layer 1, a non-magnetic layer 2 and a second magnetic layer 3 are stacked, and a toroidal magnetic layer 5 which is disposed on one surface of the laminate so that its direction along a laminate surface is its axial direction, and a write bit lines 6a and a write word line 6b (first and second write lines) pass through the toroidal magnetic layer 5. The second magnetic layer 3 and the toroidal magnetic layer 5 are bonded with a non-magnetic conductive layer 4 in between, and are electrically connected to each other.

Moreover, a read sensing lead 11 is disposed on the top surface (opposite to the toroidal magnetic layer 5) of the laminate in each of the magnetoresistive devices 12A and 12B so that a current in a perpendicular direction to the laminate surface can flow through the laminate toward the substrate 10.

The first magnetic layer 1 is a ferromagnetic layer of which the magnetization direction is pinned, and the second magnetic layer 3 is a ferromagnetic layer (a magnetic sensitive layer) of which the magnetization direction is changed by an external magnetic field. They are stacked with the non-magnetic layer 2 having a very thin thickness of a few nm (a few tens of Å) in between. In the laminate, when a voltage in a perpendicular direction to the laminate surface is applied between the first magnetic layer 1 and the second magnetic layer 3, for example, electrons of the second magnetic layer 3 pass through the non-magnetic layer 2 to be transferred to the first magnetic layer 1, thereby a tunneling current flows. In other words, the non-magnetic layer 2 in this case is a tunnel barrier layer. The tunneling current changes depending upon a relative angle between the spin of the first magnetic layer 1 and the spin of the second magnetic layer 3 in a boundary portion with the non-magnetic layer 2. More specifically, in the case where the spin of the first magnetic layer 1 and the spin of the second magnetic layer 3 are parallel to each other, the resistance of the magnetoresistive device 12A (12B) is minimum, and in the case where they are antiparallel to each other, the resistance of the magnetoresistive device 12A (12B) is maximum.

The magnetization of the second magnetic layer 3 changes by an induced magnetic field by the write bit line 6a and the write word line 6b. In this case, the magnetization of the second magnetic layer 3 is reversed by the induced magnetic field, thereby a relative angle with the magnetization of the first magnetic layer 1 is reversed. Moreover, a storage cell 12 targeted for writing is selected by a so-called matrix driving method, so the magnetic properties, dimensions and the like of the second magnetic layer 3 are set so that the magnetization can be reversed only in the case where currents flow through both of the write bit line 6a and the write word line 6b in the same direction. The above-described structure is a basic structure of the magnetoresistive device 12A (12B) as a TMR device.

In this case, the toroidal magnetic layer 5 has a tubular shape having an axis in a perpendicular direction to a paper plane, and includes a portion in which the write bit line 6a and the write word line 6b are parallel to each other. In other words, the axial direction of the toroidal magnetic layer 5 is in the extending direction of the write bit line 6a and the write word line 6b, and has a toroidal shape closed in a sectional direction across the axial direction. Moreover, the toroidal magnetic layer 5 is made of a high-permeability magnetic material, and has a function of efficiently changing the magnetization direction of the second magnetic layer 3 through confining a magnetic flux generated by a current through the included write bit lines 6a and the included write word line 6b within the toroidal magnetic layer 5. The toroidal magnetic layer 5 has a closed loop shape in cross section as shown in the drawing, and the generated induced magnetic field is rotated in the toroidal magnetic layer 5 along a plane parallel to the cross section. Thereby, the toroidal magnetic layer 5 has an electromagnetic shielding effect for preventing a leakage magnetic flux to the outside. Moreover, the toroidal magnetic layer 5 is formed so as to be in contact with one surface of the second magnetic layer 3, so a magnetic field is easily transmitted to the magnetic layer 3, and the magnetization direction of the second magnetic layer 3 in close proximity to the toroidal magnetic layer 5 at a high magnetic flux density can be changed more efficiently.

Figure 8:
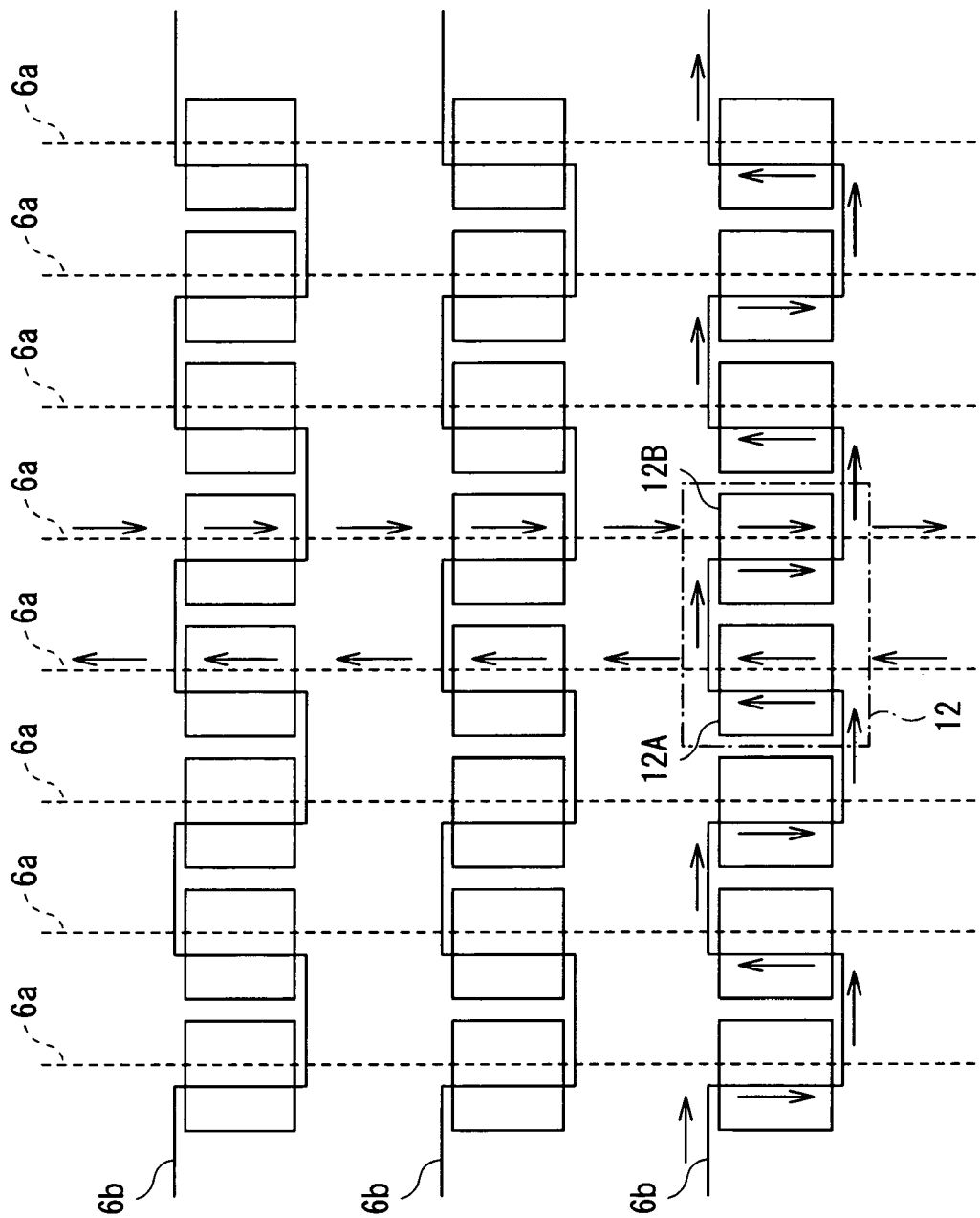
FIG. 8 is an illustration showing the storage cell of the magnetic memory device shown in FIG. 1 and a wiring structure for writing.

FIG. 8 shows the wiring structure of the write bit line 6a and the write word line 6b. As shown in the drawing, the magnetic memory device according to the embodiment includes a plurality of write bit lines 6a and a plurality of write word lines 6b extending so as to cross the write bit lines 6a. They extend so as to cross each other; however, in the intersection region, they partially extend so as to be parallel, and in a parallel portion, the magnetoresistive devices 12A and 12B are formed. In this case, parallel includes an error range of ±10° in manufacturing. In this case, the magnetization of the second magnetic layer 3 is reversed by a combined magnetic field of the write bit line 6a and the write word line 6b which are parallel to each other; however, the magnitude of the induced magnetic field is larger than that of a combined magnetic field in the case where write lines intersect each other. Therefore, a write operation can be efficiently performed.

In each of the magnetoresistive devices 12A (12B), a current flows into the laminate from the read sensing lead 11, and passes from the toroidal magnetic layer 5 to the substrate 10. Therefore, each layer of the laminate except for the non-magnetic layer 2 where a tunneling current flows, the non-magnetic conductive layer 4 and the toroidal magnetic layer 5 are made of a conductive material. For example, a cobalt-iron alloy (CoFe) is used for the first magnetic layer 1 and the second magnetic layer 3, and the simple substance of cobalt (Co), a cobalt-platinum alloy (CoPt), a nickel-iron-cobalt alloy (NiFeCo) or the like can be used. Moreover, as the first magnetic layer 1 and the second magnetic layer 3 are stabilized in a state where the magnetization directions thereof are parallel or antiparallel to each other, the easy magnetization axes of the first magnetic layer 1 and the second magnetic layer 3 are preferably parallel to each other.

The thickness of the non-magnetic layer 2 is determined by tunneling resistance and the like. In general, in a magnetic memory device using the TMR device, appropriate tunneling resistance is 10 k$\Omega \cdot (\mu m)^2$ for matching a semiconductor device such as a transistor. However, in order to achieve a higher density and a higher operation speed in the magnetic memory device, the tunneling resistance is preferably 10 k$\Omega \cdot (\mu m)^2$ or less, and more preferably 1 k$\Omega \cdot (\mu m)^2$ or less. In order to achieve such a tunneling resistance value, the thickness of the non-magnetic layer (tunnel barrier layer) 2 is preferably 2 nm or less, and more preferably 1.5 nm or less. However, when the thickness of the non-magnetic layer 2 is too thin, although the tunneling resistance can be reduced, a leakage current due to the roughness of a bonding boundary between the first magnetic layer 1 and the second magnetic layer 3 is generated, thereby a decline in a MR ratio may occur. In order to prevent the decline in the MR ratio, it is necessary for the non-magnetic layer 2 to have as small a thickness as possible without a leakage current flowing, and more specifically, the thickness of the non-magnetic layer 2 is preferably 0.3 nm or more.

The non-magnetic conductive layer 4 has a function of antiferromagnetically coupling the second magnetic layer 3 and the toroidal magnetic layer 5, and is made of, for example, ruthenium (Ru), copper (Cu) or the like. Moreover, the toroidal magnetic layer can be made of iron (Fe), a nickel-iron alloy (NiFe), Co, CoFe, NiFeCo or the like. In order to concentrate the magnetic field by the write bit line 6a and the write word line 6b on the toroidal magnetic layer 5, the permeability of the toroidal magnetic layer 5 is preferably as high as possible, and more specifically 2000 or more, and more preferably 6000 or more.

The write bit line 6a and the write word line 6b have a structure in which titanium (Ti), titanium nitride (TiN) and aluminum (Al) are stacked in order, and are electrically insulated from each other by an insulating film. The write bit line 6a and the write word line 6b may be made of at least one kind selected from aluminum (Al), copper (Cu) and tungsten (W).

On the substrate 10 on which the magnetoresistive devices 12A and 12B are formed, an epitaxial layer 9 is formed, and on the epitaxial layer 9, a conductive layer 8 and an insulating layer 7 are formed. The conductive layer 8 includes conductive layers 8A and 8B insulated from each other by the insulating layer 7 sandwiched between the conductive layers 8A and 8B. The magnetoresistive devices 12A and 12B are formed on the top surfaces of the conductive layer 8 and the insulating layer 7, and they are positioned so that at least parts of regions where the magnetoresistive devices 12A and 12B are formed are overlapped with regions where the conductive layers 8A and 8B are formed. Therefore, the magnetoresistive devices 12A and 12B are separately bonded to the conductive layers 8A and 8B which are separated and insulated from each other, so that the magnetoresistive devices 12A and 12B are electrically insulated from each other. In other words, in this case, wiring is carried out so that the magnetoresistive devices 12A and 12B are not electrically conducted.

Moreover, in this case, the substrate 10 is an n-type silicon wafer. In general, an impurity, P (phosphorus) is diffused into the n-type silicon wafer, and as the substrate 10, an $n^{++}$-type silicon wafer formed through diffusing a high concentration of P (phosphorus) is used. On the other hand, the epitaxial layer 9 is an $n^-$-type formed through diffusing a low concentration of P (phosphorus). Moreover, the conductive layer 8 is made of metal. At this time, when the epitaxial layer 9 made of the $n^-$-type semiconductor and the conductive layer 8 made of metal are brought into contact with each other, a bandgap occurs to form a Schottky diode, that is, the backflow prevention diode 13A or 13B in the embodiment.

The backflow prevention diodes 13A and 13B are formed as Schottky diodes, because a silicon wafer including an epitaxial layer has advantages such as easy availability, low cost, and easy forming processes. However, in the Schottky diode, a leakage current is a few hundreds times or more larger than that in a PN junction diode, and in addition, an increase in the leakage current according to an increase in temperature is large. In the case where the magnetic memory device is an MRAM semiconductor memory chip, and a few thousands of Schottky diodes are connected in parallel in each storage cell 12, it is considered that the leakage current is largely increased, so the leakage current may cause a decline in the S/N ratio of the read output. In this case, as the backflow prevention diode 13, the Schottky diode which is advantageous in cost and manufacturing is used; however, in the case where the leakage current is considerable, as the backflow prevention diode 13, a PN junction diode, a diode formed by a short circuit between the base and the collector of a BJT or a diode formed by a short circuit between the gate and the drain of a MOSFET can be used.

Figure 9:
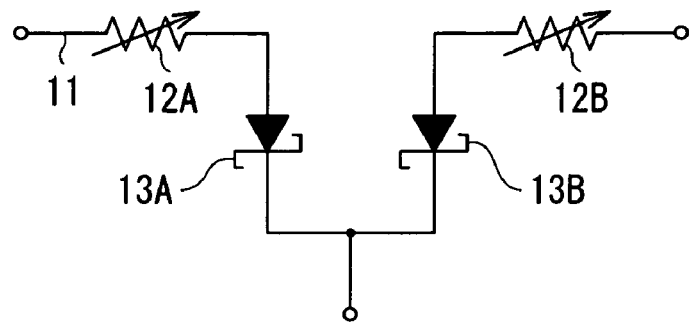
FIG. 9 is an illustration showing an equivalent circuit of the storage cell shown in FIG. 7.

FIG. 9 shows a circuit diagram of the storage cell. In the drawing, in the pair of magnetoresistive devices 12A and 12B, the value of a flowing current is changed depending upon a relative angle between the magnetization of the first magnetic layer 1 and the magnetization of the second magnetic layer 3, so they are considered as variable resistors. In other words, the magnetoresistive device 12A (12B) has a low resistance state in which the current density of a tunnel current allowed to flow therethrough is high and a low resistance state in which the current density is low.

In the embodiment, information is stored considering one of the magnetoresistive devices 12A and 12B as low resistance and the other as high resistance, which will be described in detail in a later description about operation. It is because outputs from two magnetoresistive devices 12A and 12B are differentially amplified to be read out. Therefore, it is necessary to manufacture the pair of the magnetoresistive devices 12A and 12B so as to have the same resistance, the same magnetoresistive ratio and the same magnitude of a reversed magnetic field of the second magnetic layer 3.

[Write Operation on Storage Cell]

Next, an information storing system in the storage cell 12 and a writing method will be described below.

Figures 10A, 10B:
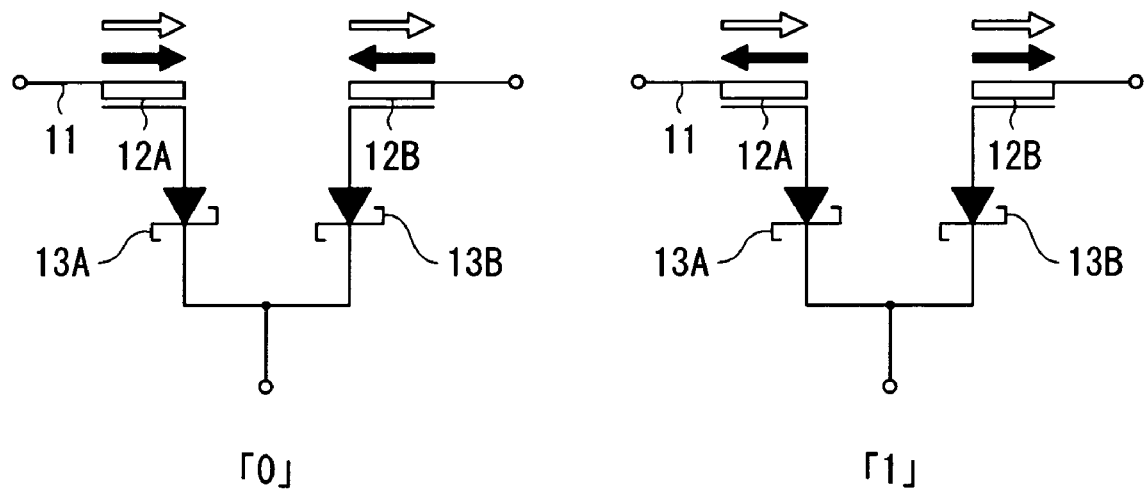
FIGS. 10A and 10B are illustrations for describing a method of storing information in the storage cell shown in FIG. 7.

FIGS. 10A and 10B show a storage cell as in the case of FIG. 9, and the magnetization of the first magnetic layer 1 and the magnetization of the second magnetic layer 3 in each of the magnetoresistive devices 12A and 12B are shown. In the drawing, a white arrow indicates the magnetization of the first magnetic layer 1, and the magnetization of the first magnetic layers 1 in the magnetoresistive devices 12A and 12B are pinned in a rightward direction. On the other hand, a black arrow indicates the magnetization of the second magnetic layer 3, and the second magnetic layer 3 in the magnetoresistive device 12A and the second magnetic layer 3 in the magnetoresistive device 12B are magnetized in a direction antiparallel to each other. Thus, in the storage cell 12, information is stored in a state where the magnetization directions of the second magnetic layers 3 in the magnetoresistive devices 12A and 12B are antiparallel to each other.

At this time, in the pair of magnetoresistive devices 12A and 12B, the combination of the magnetization directions of each first magnetic layer 1 and each second magnetic layer 3 is always a first state of (antiparallel, parallel) or a second state of (parallel, antiparallel). Therefore, the two states correspond to binary information "0" and "1", thereby 1 bit of information is stored in one storage cell 12. Moreover, when the magnetization directions of the first magnetic layer 1 and the second magnetic layer 3 are parallel in the magnetoresistive device 12A (12B), the magnetoresistive device 12A (12B) is brought into a low resistance state in which a large tunneling current flows, and when they are antiparallel, the magnetoresistive device 12A (12B) is brought into a high resistance state in which a small tunneling current flows. In other words, either of the pair of the magnetoresistive devices 12A and 12B is always brought into a low resistance state, and the other is always brought into a high resistance state, thereby information is stored.

Figure 11:
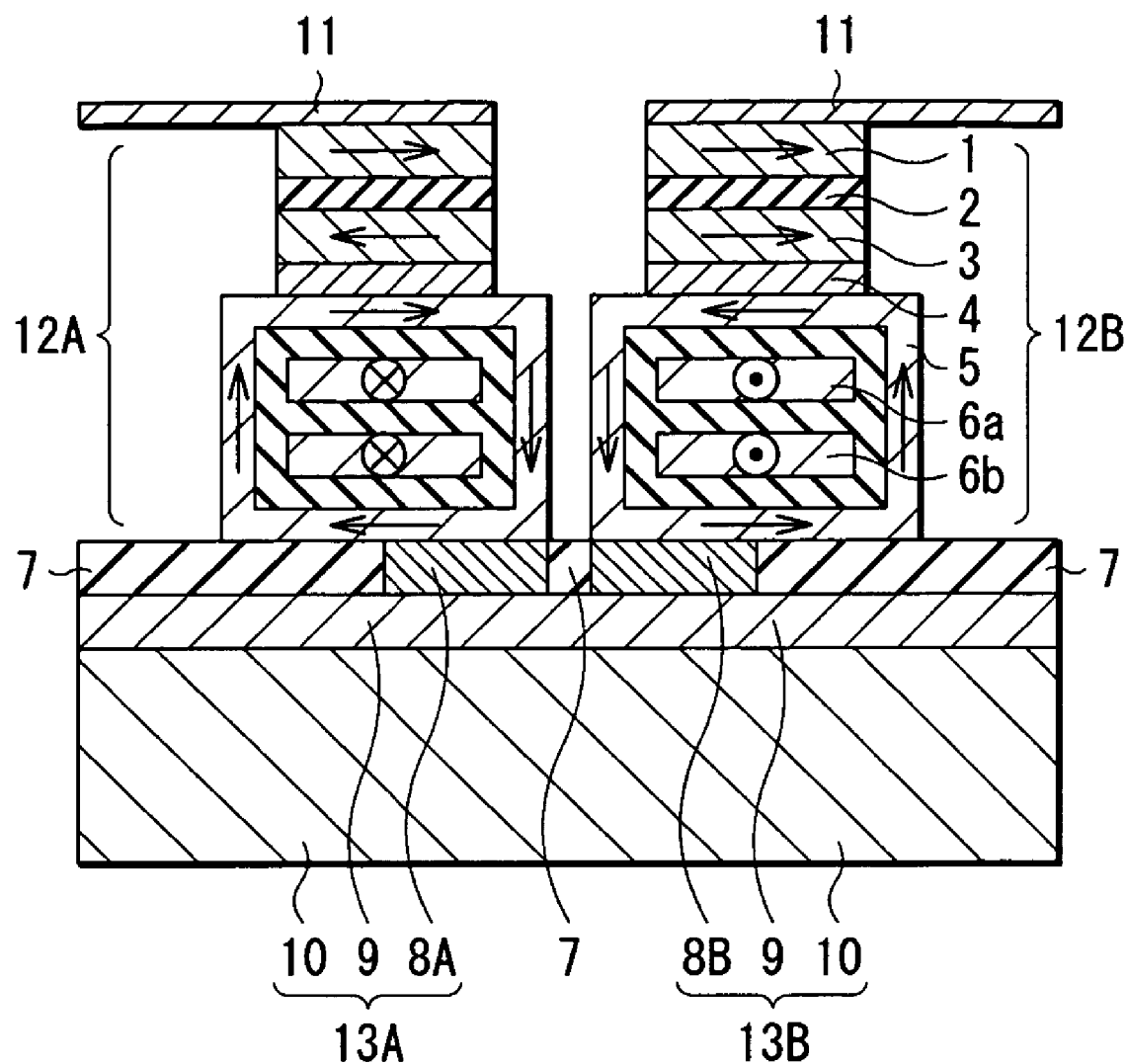
FIG. 11 is an illustration for describing a method of writing information into the storage cell shown in FIG. 7.

Thus, in the pair of magnetoresistive devices 12A and 12B, the magnetization directions of the second magnetic layers 3 are antiparallel to each other, so as shown in FIG. 11, currents flow in relatively opposite directions through the write bit lines 6a and the write word lines 6b in the magnetoresistive devices 12A and 12B (refer to FIG. 8). FIG. 11 shows the direction of a write current in the case where a "1" bit shown in FIGS. 10A and 10B is written on the storage cell 12.

Thereby, magnetic fields rotated in opposite directions are induced into the toroidal magnetic layers 5 of the magnetoresistive devices 12A and 12B, and the magnetizations (that is, the directions of the induced magnetic fields) in surfaces of the toroidal magnetic layers 5 facing the second magnetic layers 3 are antiparallel to each other. The magnetizations of the second magnetic layers 3 in the magnetoresistive devices 12A and 12B are antiparallel to each other according to the directions of the magnetic fields applied from outside, and the magnetization states of the second magnetic layers 3 are pinned by antiferromagnetic coupling to the toroidal magnetic layer 5. When a "0" bit is written, the directions of currents flowing through the magnetoresistive devices 12A and 12B are turned to opposite directions to the directions shown in the drawing.

At this time, the induced magnetic field is confined in the toroidal magnetic layer 5, so an effective magnetic field strength contributing to the reversal of the magnetization of the second magnetic layer increases, compared to that in the related art. As a result, the magnetization of the second magnetic layer 3 can be reversed with a sufficient magnetic field strength, and an efficient write operation can be performed. In other words, in the write operation, the magnetization of the second magnetic layer 3 is aligned in a predetermined direction so as to be sufficiently large. Therefore, the possibility that the magnetization direction of the second magnetic layer 3 is disturbed by an external disturbance magnetic field is reduced, and written information can be prevented from being erased or rewritten unexpectedly. In other words, information can be reliably written.

In the magnetic memory device, at first, the address buffer 101 takes a signal voltage from the external data terminals A0 through A20 to amplify the voltage in an internal buffer, and the voltage is transmitted to the Y-direction and X-direction address decoders 106A and 108A through the address lines 105 and 107. At the same time, the data buffer 102 takes a signal voltage from the external data terminals D0 through D7 to amplify the voltage in an internal buffer, and the voltage is transmitted to the Y-direction and X-direction current drives 106C and 108C through the write data buses 110 and 111 (refer to FIG. 1).

The address decoders 106A and 108A select a write bit line 6a and a write word line 6b having a decode value corresponding to a selection signal by the selection signal. Moreover, the directions of currents flowing through the write bit line 6a and the write word line 6b are determined by the current drives 106C and 108C. Thereby, a storage cell 12 in which currents flow through both of the write bit line 6a and the write word line 6b is uniquely selected, and predetermined bit data is written into the storage cell 12. In FIG. 8, the directions of currents flowing through the write bit line 6a and the write word line 6b are indicated by arrows, and a state where the storage cell 12 is selected is shown.

[Read Operation]

The magnetic memory device reads out information written into each storage cell 12 as below.

(Basic Operation)

Figure 12:
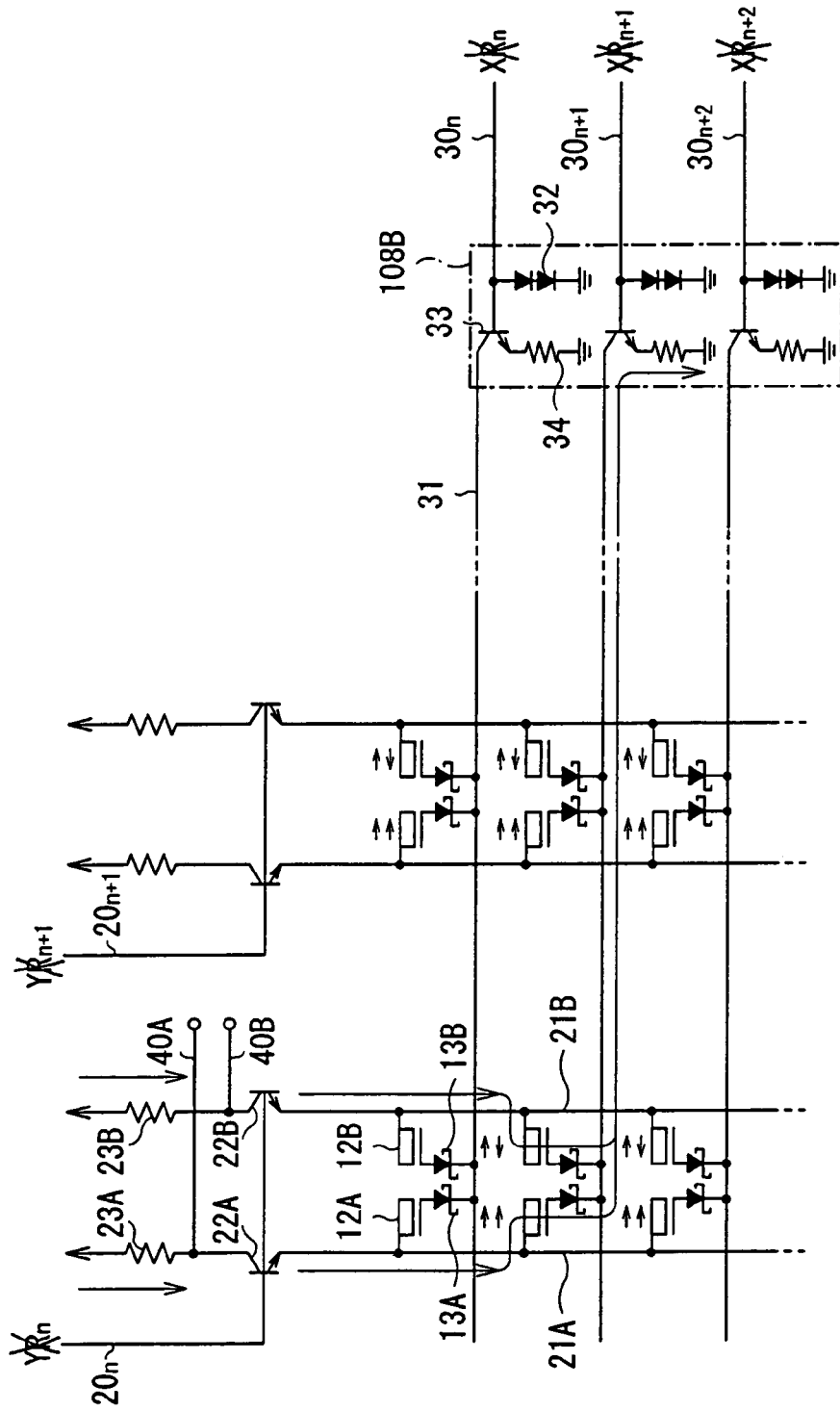
FIG. 12 is an illustration for describing the principle of reading from the storage cell in the magnetic memory device shown in FIG. 1.

FIG. 12 shows the basic structure of the storage cell. At first, referring to the drawing, a basic part of the read operation will be described below. Each storage cell 12 is in a state where information is stored through bringing the magnetization directions in the magnetoresistive devices 12A and 12B into a state shown in the drawing. The storage cell 12 from which the information is to be read out is selected through inputting a selection signal into the bit decode line 20 in a Y direction and the word decode line 30 in an X direction according to the address of the storage cell 12. For example, when the selected storage cell 12 is in a Yn column and an Xn+1 row, a signal is inputted into the Ynth bit decode line 20n and the Xn+1th word decode line 30n+1.

When the voltage level in the Ynth bit decode line 20n is "High", the transistors 22A and 22B are brought into conduction, and a sensing current flows through the Ynth column direction block (bit array Yn) of the storage cells 12. The sensing current flows through the sense bit lines 21A and 21B from the side closer to the power source Vcc to the opposite side.

On the other hand, when the voltage level in the Xn+1 word decode line 30n+1 is "High", the transistor 33 is brought into conduction, thereby a current is allowed to flow through the Xn+1th row direction block (word array Xn+1) of the storage cells 12. Therefore, the sensing current flows from the Ynth sense bit line 21A to the Xn+1th sense word line 31 through the magnetoresistive device 12A and the backflow prevention diode 13A and from the Ynth sense bit line 21B to the Xn+1th sense word line 31 through the magnetoresistive device 12B and the backflow prevention diode 13B, and then the sensing current flows from the resistor 34 to the ground through the collector-emitter of the transistor 33 of the constant current circuit 108B. Thus, the storage cell 12 in the Ynth column and the Xn+1th row is selected through flowing the sensing currents to the magnetoresistive devices 12A and 12B in the Ynth column and the Xn+1th row.

Information is read out through detecting a difference between current values flowing through the magnetoresistive devices 12A and 12B in the storage cell 12. The currents flowing through them are approximately equal to the sensing currents flowing through the sense bit lines 21A and 21B. Moreover, a voltage drop occurs across the current-voltage conversion resistor 23A (23B) connected to the sense bit line 21A (21B) in series. The voltage drop Va is determined by Formula 1, where the magnitude of the sensing current is Isense, the resistance of the current-voltage conversion resistor 23A (23B) is Ra.

$$Va(\text{Volt}) = \text{Isense}(A) \times Ra(\Omega) \quad \text{(Formula 1)}$$

As can be seen from Formula 1, the values of the current-voltage conversion resistor 23A and the current-voltage conversion resistor 23B are the same, the sensing current Isense is detected by the voltage drop Va through converting the sensing current Isense into a voltage. Therefore, in this case, voltage drops across the current-voltage conversion resistor 23A and current-voltage conversion resistor 23B are taken out of the input lines 40A and 40B as read output signals, and then a difference between the read output signals is detected. Thus, a difference between the output values is taken out through the use of two magnetoresistive devices 12A and 12B, thereby the storage cell 12 can obtain a large output value from which noises are eliminated.

(Effect of Constant Current Circuit 108B)

In the above read operation, the magnitude of the sensing current flowing through the selected storage cell 12 is adjusted by the current controlling resistor 34 disposed on the ground side of the sense word line 31. The current controlling resistor 34 has an effect of limiting the current amount by itself; however, in this case, the constant current circuit 108B including the current controlling resistor 34, the transistor 33 and the diode 32 limits the current amount within a certain range.

When the voltage level in the word decode line 30 is "High", two diodes 32 connected in series fixedly produces a intermediate voltage level which is +2Φ higher than the ground by the bandgap reference of the diodes. Therefore, the intermediate voltage level is applied to the base terminal of the transistor 34, thereby the transistor 34 is brought into conduction. At this time, the magnitude of the sensing current Isense flowing from the sense word line 31 is determined by Formula 2, where the resistance of the current controlling resistor 34 is Rc.

$$\text{Isense}(A) = (2\phi' - \phi'')(\text{Volt})/Rc(\Omega) \quad \text{(Formula 2)}$$

In the formula, $2\phi'$ is a forward voltage of two diodes 32 in series, and $\phi''$ is a forward voltage between the base and the emitter of the transistor 33. They are specific values of semiconductor devices, so Formula 2 shows that when the resistance Rc is determined, the sensing current Isense is a constant value, and the sensing current Isense is uniquely determined by the resistance Rc as a parameter.

In other words, a weak sensing current Isense within a certain range stably flows through the sense word line 31 by the constant current circuit 108B. The sensing current Isense in Formula 2 is a current flowing through the sense word line 31, and is the total sum of currents flowing through both of the sense bit line 21A and the sense bit line 21B or both of the magnetoresistive device 12A and the magnetoresistive device 12B.

As an example, in the case where the current controlling resistor 34 has 50 kΩ, and a silicon diode and a silicon transistor are used as the diode 32 and the transistor 33, the sensing current Isense by the constant current circuit 108B is approximately 15 μA. In this case, even if the range of resistance which can be obtained by the pair of magnetoresistive devices 12A and 12B during driving is different because of a cause in manufacturing, the total sum of currents flowing through the magnetoresistive devices 12A and 12B is always approximately equal to 15 μA. Variations in resistance of the magnetoresistive device 12A (12B) due to the cause in manufacturing means that the resistance is changed by a thickness and slight disorder in atomic arrangement, because the non-magnetic layer 2 has only a thickness of a few nm (a few tens Å), that is, a few atomic unit. Therefore, close attention is paid to form the non-magnetic layer 2 with a uniform thickness; however, in reality, variations in the resistance of the magnetoresistive device 12A (12B) approximately from 15% to 50% occurs, and in the case where the conditions of manufacturing facilities and the like are poor, variations larger than the above range occurs.

It can be considered that there are two cases of variations in the resistance of the magnetoresistive devices 12A and 12B according to factors. (1) One of the cases is the case where the resistances of the magnetoresistive devices 12A and 12B in a low resistance state and a high resistance state are different because of variations in the thickness of the non-magnetic layer between the storage cells 12. In most cases, when the thickness of the non-magnetic layer 2 increases, the pair of magnetoresistive devices 12A and 12B have a large resistance value in a low resistance state and a high resistance state. (2) The other case is the case where the ratio between the resistance when a large tunnel current flows and the resistance when a small tunnel current flows, that is, the MR ratio varies with the pair of magnetoresistive devices 12A and 12B of each storage cell 12, because of the roughness of a bonding boundary, a difference in thickness of the non-magnetic layer 2 or any other causes.

It is assumed that (1) variations in the resistances of the magnetoresistive devices 12A and 12B among the storage cells 12 occur. Current values flowing through the sense bit lines 21A and 21B are values corresponding to the resistances of the pair of magnetoresistive devices 12A and 12B, respectively; however, the total sum of the current values is controlled so as to be always constant. In other words, a normalized current amount is shared between current values flowing through the sense bit lines 21A and 21B according to a resistance ratio. Therefore, compared to the degree of variations in the resistance, variations in each current value are reduced. Moreover, in the case where variations in resistance between the storage cells 12 do not cause a change in each MR ratio, the resistance ratios of the pair of magnetoresistive devices 12A and 12B are equal, so irrespective of the resistance of each storage cell 12 (even if the resistance is largely different), the current values of the sense bit lines 21A and 21B are substantially the same. Thus, a difference between the current values through the sense bit lines 21A and 21B always falls in a constant range. Therefore, a difference between the voltage drops across the current-voltage conversion resistors 23A and 23B falls in a constant range, and a stable differential output can be obtained, thereby the S/N ratio of the read signal can be improved.

On the other hand, as can be seen from the above description, (2) variations in the MR ratio of the magnetoresistive device 12B to the magnetoresistive device 12A, specifically a decline in the MR ratio is critical in the case of obtaining a differential output, so the S/N ratio of an output signal largely declines. However, in this case, the constant current circuit 108B is included, so variations in currents through the sense bit lines 21A and 21B can be suppressed by the total current value. Thereby, the range of fluctuation in the voltage drops across the current-voltage conversion resistors 23A and 23B can be limited within a constant range, and variations in an offset voltage in the input of the sense amplifier 106B can be reduced. Therefore, in this case, the S/N ratio of the output signal in reading can be prevented.

(Effect of Backflow Prevention Diode)

In the above read operation, the backflow prevention diodes 13A and 13B which are disposed on current paths of the magnetoresistive devices 12A and 12B on a side closer to the sense word line 31 prevent a current from flowing back from the sense word line 31 to the magnetoresistive devices 12A and 12B.

In this case, each of the magnetoresistive devices 12A and 12B in the bit array Yn and the word array Xn is connected to the common sense bit lines 21A and 21B and the common sense word line 31, so a part of the sensing current may go out of a proper path, and may flow to a different path through the magnetoresistive devices 12A and 12B which are not targeted for reading, thereby the part of the sensing current may flow to the ground, or may go back to the proper path. Even so, such a wiring structure is used, because as the selection switch of the storage cell 12, a single switch is shared among storage cells 12 in each array in a bit direction and a word direction so that wiring is simplified, and in this case, the constant current circuit 108B is commonly used in each array.

A current component going out of the proper path and flowing through a circuit, specifically a roundabout component is generated on a path where the component flows backward through the magnetoresistive device 12A (12B). However, in this case, the path is blocked by the backflow prevention diodes 13A and 13B which are one-direction devices.

Figure 13:
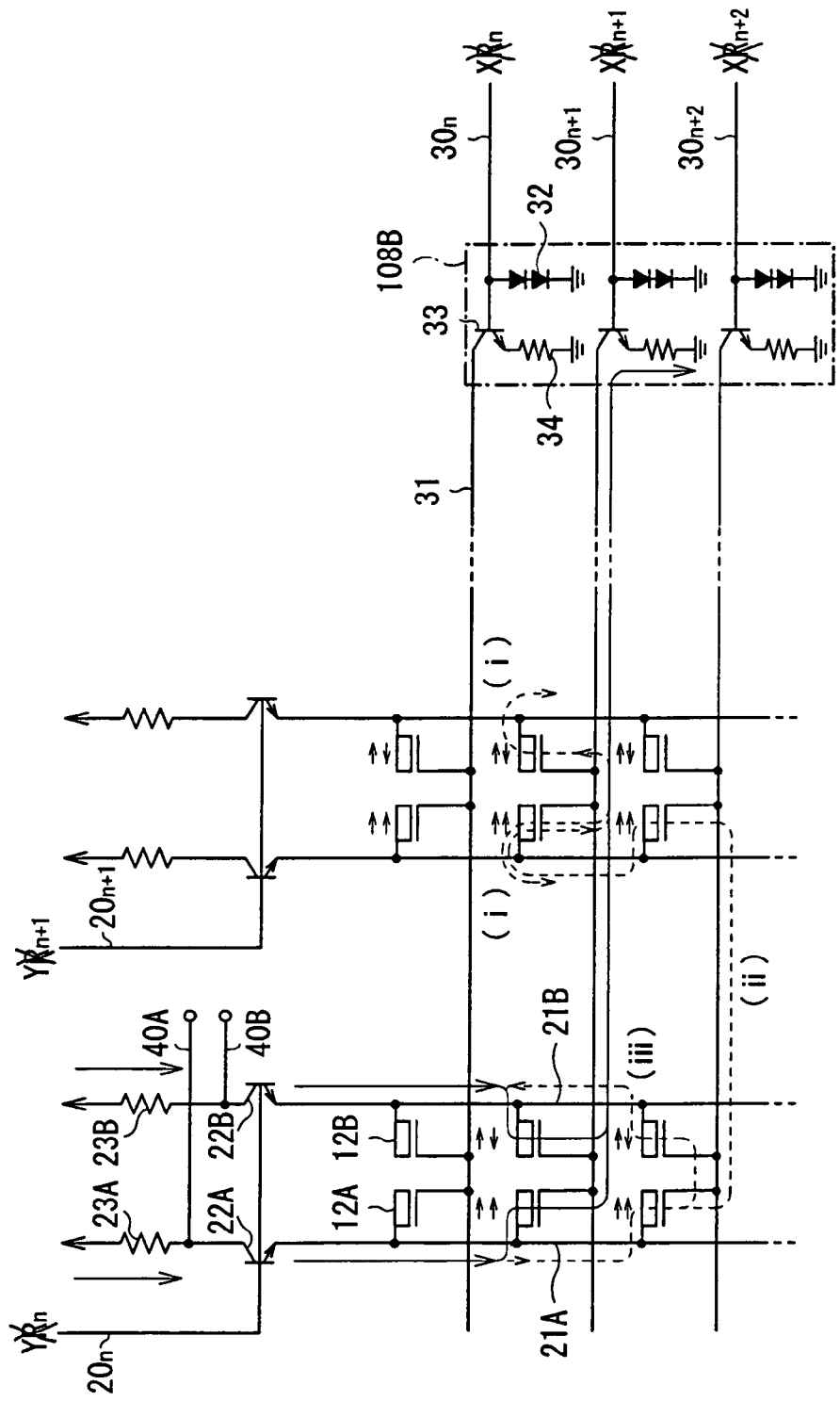
FIG. 13 is a circuit diagram for describing a comparative example relative to the readout circuit shown in FIG. 2.

FIG. 13 shows a path (i) of a leakage current in the case where the backflow prevention diodes 13A and 13B are not disposed on the current paths of the magnetoresistive devices 12A and 12B, roundabout paths (ii) and (iii) as comparative examples relative to the embodiment. In the drawing, the storage cell 12 in the bit array Yn and the word array Xn+1 is a cell from which information is just about to be read out. The proper current path is indicated by a solid line.

On the other hand, a part of the sensing current flows back from the sense word line 31 to adjacent magnetoresistive devices 12A and 12B in a word array direction and then to the sense bit line 20n+1, for example, along the path (i). The similar leakage occurs in a large number of magnetoresistive devices 12A and 12B (not shown) which are commonly connected to the same sense word line 31.

Moreover, for example, as in the case of the path (ii), there is a path taking a roundabout way through the magnetoresistive device 12A (12B) of the storage cell 12 on a low resistance side. In the drawing, a path is shown considering the magnetoresistive devices 12A as a low resistance side in all storage cells 12. In this case, the sensing current further flows down through the sense bit line 21A, and passes through the magnetoresistive device 12A which are adjacent in a bit array direction and is in a low resistance state, and then flows back through the magnetoresistive devices 12A in a low resistance state of an adjacent storage cell 12 in a word array direction via the sense word line 31. After that, the sensing current flows through the sense bit line 21A which is not the proper path to the magnetoresistive device 12A (in the drawing, adjacent in a bit array direction) connected to the selected sense word line 31, and flows into the magnetoresistive device 12A in a low resistance state, and finally flows into the selected sense word line 31. The similar roundabout path occurs in a large number of magnetoresistive devices 12A (not shown) connected to the same sense bit line 21A, and a large number of magnetoresistive devices 12A and 12B (not shown) connected to the same sense word line 31 which is connected to the magnetoresistive devices 12A. The same roundabout path occurs in the case where the magnetoresistive devices 12B are in a low resistance state.

Another example of a roundabout path is a path (iii). In this case, the sensing current flows back from the magnetoresistive device 12A (on a low resistance side) connected to the same sense bit line 21A to the magnetoresistive device 12B (on a high resistance side) through either of the magnetoresistive device 12A or the magnetoresistive device 12B to pass through one storage cell 12. Moreover, the sensing current flows upward through the sense bit line 21B on an opposite side, and passes from the magnetoresistive device 12B of the storage cell 12 targeted for reading to the proper path.

All of the paths (i) through (iii) can be blocked through arranging the backflow prevention diodes 13A and 13B on a current path of each of the magnetoresistive devices 12A and 12B. Thus, fluctuations in the sensing current which occurs when the current leaks or takes a roundabout path through the magnetoresistive devices 12A and 12B, that is, noises in a signal can be reduced. In the case where the current paths of the magnetoresistive devices 12A and 12B in each storage cell 12 is connected to one diode, the paths (i) and (ii) can be blocked, and a constant effect of preventing the leakage or the roundabout path of the current is expected. However, in order to block the path (iii), as in the case of the embodiment, it is necessary to bring the magnetoresistive devices 12A and 12B in the storage cell 12 out of conduction, and to separately take measures for preventing backflow in the magnetoresistive devices 12A and 12B.

(Modification of Backflow Prevention Diode)

Figure 14:
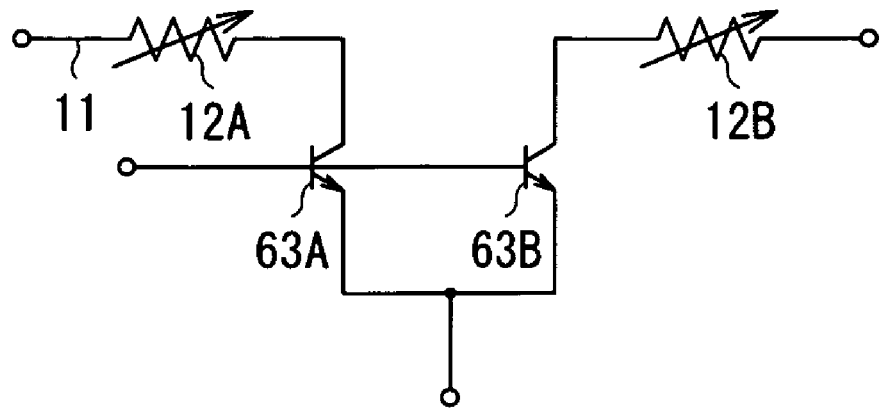
FIG. 14 is an illustration showing a rectifying device according to a modification of a backflow prevention diode in the readout circuit shown in FIG. 2 and its layout.

The backflow prevention diodes 13A and 13B in the embodiment can be replaced with transistors which are devices having the same rectifying function. FIG. 14 shows the case where backflow prevention transistors 63A and 63B are disposed between the magnetoresistive devices 12A and 12B and the sense word line 31 as such a modification. When the base terminals of the backflow prevention transistors 63A and 63B are connected to the bit decode line 20 or the word decode line 30, the backflow prevention transistors 63A and 63B can be brought into conduction together with the sense bit lines 21A and 21B or the sense word line 31. In this case, the transistors 22A and 22B may be removed. Such backflow prevention transistors 63A and 63B function as one-direction devices in the same manner.

An advantage of using the backflow prevention transistors 63A and 63B is that a voltage during conduction is much lower than the forward voltage of a diode. A collector-emitter voltage during conduction of the transistor is very low (approximately 0.2 V); however, a voltage of a bandgap $\Phi$ (0.65V to 0.75V) as a forward voltage is applied to the diode. In the readout circuit according to the embodiment, a current path has a five-stage structure including the current-voltage conversion resistor 23A (23B), the transistor 22A (22B), the magnetoresistive device 12A (12B), the backflow prevention diode 13A (13B), the transistor 33, and the current controlling resistor 34 from the power source Vcc to the ground in series. Therefore, it is necessary to consider voltage distribution; however, the backflow prevention transistors 63A and 63B can operate at a power source voltage which is approximately 0.5 V lower than that in the backflow prevention diodes 13A and 13B. Moreover, by distributing a surplus of the voltage, circuits can be increased to a few stages more than five stages, and more complicated control operation can be performed.

Figure 15:
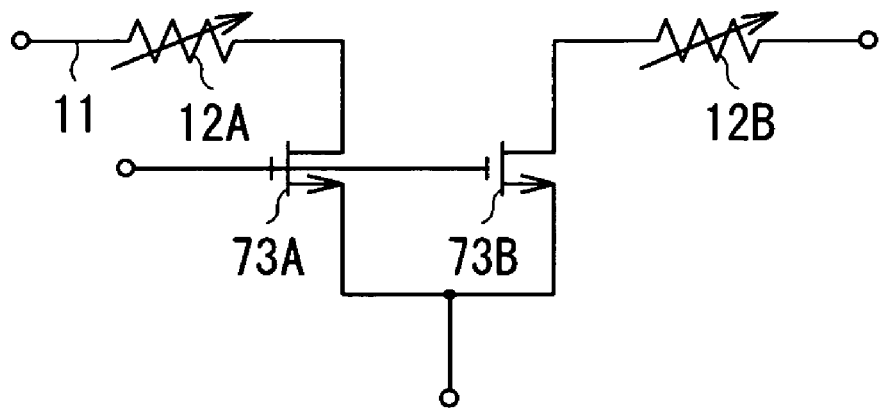
FIG. 15 is an illustration showing a rectifying device according to a modification of the Backflow prevention diode in the readout circuit shown in FIG. 2 and its layout.

Moreover, as shown in FIG. 15, the backflow prevention diodes 13A and 13B can be replaced with backflow prevention MOSFETs 73A and 73B. In this case, a drain-source voltage during conduction is as low as approximately 0.1 V, and the functions and the effects are substantially the same as those in the backflow prevention transistors 63A and 63B.

Figure 16:
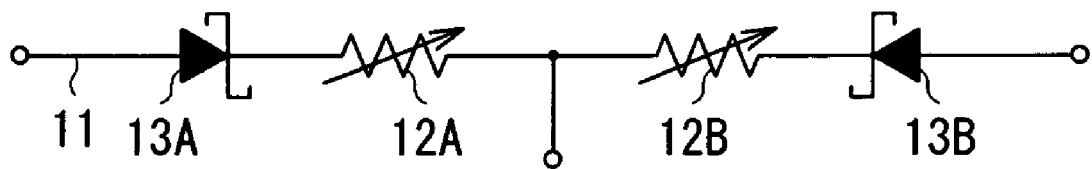
FIG. 16 is an illustration showing the layout of a modification of the backflow prevention diode in the readout circuit shown in FIG. 2.
Figure 17:
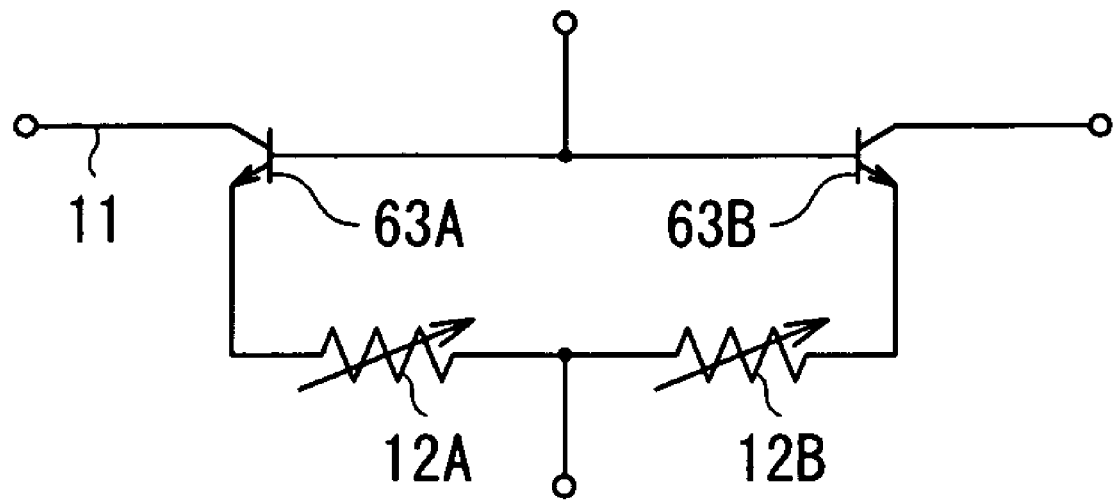
FIG. 17 is an illustration showing a rectifying device according to a modification of the backflow prevention diode in the readout circuit shown in FIG. 2 and its layout.
Figure 18:
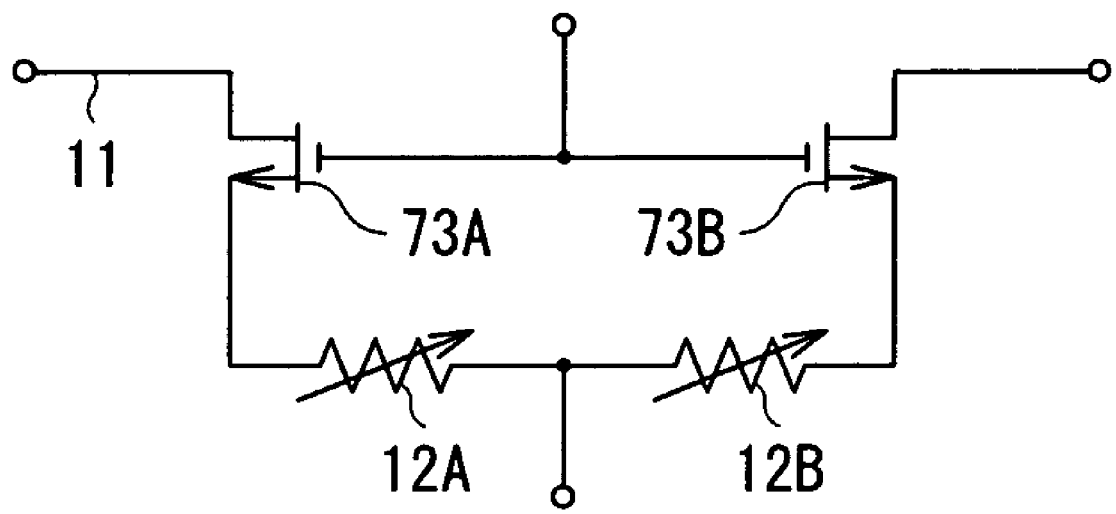
FIG. 18 is an illustration showing a rectifying device according to a modification of the backflow prevention diode in the readout circuit shown in FIG. 2 and its layout.

As shown in FIGS. 16 through 18, these rectifying devices may be disposed between the sense bit lines 21A and 21B and the magnetoresistive devices 12A and 12B.

(Signal Output Operation in a Stage Later than Sense Amplifier)

When a potential difference taken out of the input lines 40A and 40B is differentially amplified by the sense amplifier 106B (refer to FIG. 2), an output with a larger value and a good S/N ratio can be obtained. The collectors of a large number of sense amplifiers 106B of bit direction unit readout circuits 80 ( . . . , 80n, 80n+1, . . . ) are cascaded to the output lines 51A and 51B, and when one bit decode line 20 is selected among a plurality of bit decode lines 20, and at the same time, the transistor 44 is brought into conduction, one corresponding sense amplifier 106B is brought into an active state, thereby only a collector output from the sense amplifier 106B is transferred to the output lines 51A and 51B.

In this case, the bias resistors 42A and 42B are commonly used, so the path of a current supplied from the power source (Vcc) to each sense amplifiers 106B is unified. The unified current path contributes to equalization of current amounts flowing through the transistors 41A and 41B of each sense amplifier 106B, and has a function of stabilizing an offset amount relative to an output value. Moreover, the transistors 22A and 22B, the current-voltage conversion resistors 23A and 23B and the sense amplifier 106B are packed in a region with the same width W as that of the storage cell 12, so in devices among them forming a differential pair, substantially the same temperature change occurs during operation. Thereby, fluctuations in the output value resulting from a temperature change can be prevented.

The output of the sense amplifier 106B is inputted into the output buffer 102B through the output lines 51A and 51B and the read data bus 112. The output buffer 102B amplifies an inputted signal voltage, and outputs the voltage as a binary voltage signal from the external data terminals D0 through D7.

Thus, in the embodiment, the magnetoresistive devices 12A and 12B each include the toroidal magnetic layer 5, so writing can be efficiently performed, and at the same time, information can be reliably written through sufficiently aligning the magnetization direction of the second magnetic layer 3. Therefore, when information is read out, in a state where the magnetization of the second magnetic layer 3 is sufficiently aligned in a predetermined direction, the value of a tunnel current in the magnetoresistive device 12A (12B) clearly indicates a binary state by a relative magnetization direction to the first magnetic layer 1, so an output value with a high S/N ratio can be obtained.

In addition to this, in this case, the storage cell 12 includes a pair of magnetoresistive devices 12A and 12B, and currents flowing through the magnetoresistive devices 12A and 12B are differentially outputted, so noises relating to the sense bit lines 21A and 21B can be removed. Moreover, the constant current circuit 108B is disposed on the ground side of the sense word line 31 so that the total sum of the sensing currents flowing through the readout circuit is maintained constant, so a difference between the current amounts through the sense bit lines 21A and 21B always falls in a constant range irrespective of variations in characteristics of each storage cell 12. Thus, when the total current value is a constant value, even in the case where the resistance between a pair of magnetoresistive devices 12A and 12B exists, fluctuations in current values flowing through the sense bit lines 21A and 21B can be reduced. Therefore, a stable differential output can be obtained, and the S/N ratio of the read signal can be improved. The transistor 33 of the constant current circuit 108B also functions as a semiconductor switch of the word decode line 3, so the transistor 33 can be relatively easily manufactured, and is advantageous in circuit design.

Moreover, the backflow prevention diodes 13A and 13B as one-direction devices are disposed between the magnetoresistive devices 12A and 12B and the sense word line 31, so a current can be prevented from flowing back from the sense word line 31 to the magnetoresistive devices 12A and 12B. Thereby, a current path can be prevented from being formed between the storage cells 12 connected to the common sense bit lines 21A and 21B or the common sense word line 31 or between the magnetoresistive device 12A and the magnetoresistive device 12B in one storage cell 12, and the leakage or the roundabout of the sensing current can be blocked, so noises can be reduced.

Moreover, in the embodiment, the sense amplifiers 106B are cascaded to the output lines 51A and 51B so as to share the bias resistors 42A and 42B among them, so the current amounts flowing through the transistors 41A and 41B are equalized, and the offset amount relative to the output value of each sense amplifier 106B can be constant. Further, the number of resistor components can be reduced, so power consumption by a leakage current (a current steadily flowing into a portion except for a portion to be operated because of the circuit structure) can be reduced. Moreover, the number of components is reduced, and as the output lines of each sense amplifier 106B, a pair of output lines 51A and 51B are commonly used, so a space for circuits can be reduced.

In addition, the transistors 22A and 22B and the current-voltage conversion resistors 23A and 23B are packed in a circuit area of the sense amplifier 106B together with sense amplifier 106B, so a pair of circuit devices forming a differential amplification circuit together with the sense amplifier 106B are formed in positions adjacent to each other. Therefore, the circuit devices are driven in the same temperature conditions, so variations in characteristics due to a temperature change can be prevented, and noises in the differential amplification circuit can be prevented.

As described above, in the readout circuit in the magnetic memory device according to the embodiment, noises due to variations in characteristics of each storage cell 12, noises due to variations in resistance between a pair of magnetoresistive devices 12A and 12B can be reduced, and noises related to the data line, noises due to variations in characteristics of the sense amplifiers 106B and other differential pairs, and noises of a peripheral circuit traveling from a power source circuit can be reduced, so the S/N ratio of a read signal output can be largely improved. Therefore, the magnetic memory device can perform a stable operation with less reading errors. Moreover, a large signal output value can be obtained by an improved S/N ratio, so in the case where the packing density of the storage cells 12 is increased, a sufficient output can be obtained, and a drive at a low current and a low voltage can be achieved.

In general, in the magnetic memory device, in order to prevent a dielectric breakdown of an extremely thin tunnel barrier layer, when a tunnel current flows through the magnetic storage device, it is necessary to control a voltage applied to the device to be an appropriate value. In the magnetic memory device according to the embodiment, the constant current circuit 108B is included, so a tunnel current can be reduced, and a voltage to the tunnel barrier layer 2 can be reduced to a sufficiently lower voltage than an electrical withstand voltage to drive the magnetic memory device. Moreover, the readout circuit according to the embodiment has a five-stage structure in which a current path includes the current-voltage conversion resistor 23A (23B), the transistor 22A (22B), the magnetoresistive device 12A (12B), the backflow prevention diode 13A (13B), the transistor 33 and the current controlling resistor 34 in series from the power source Vcc to the ground. A voltage drop across the magnetoresistive device 12A (12B) can be held down to approximately 0.1 V to 0.3 V by a relationship of voltage division. Voltage outputs directly obtained from the magnetoresistive devices 12A and 12B (voltage drops across the current-voltage conversion resistors 23A and 23B) in this case are weak; however, the S/N ratio is high by an effect of making the sensing current constant. In this case, the output is amplified by a few more differential amplification circuits to obtain a final output, so sufficient reading sensitivity can be obtained. In other words, the magnetic memory device can be driven at a extremely weak tunnel current, compared to a magnetic memory device in a related art, and while the dielectric breakdown of the magnetoresistive devices 12A and 12B can be prevented, a sufficiently large signal output with a superior S/N ratio can be obtained.

Second Embodiment

Figure 19:
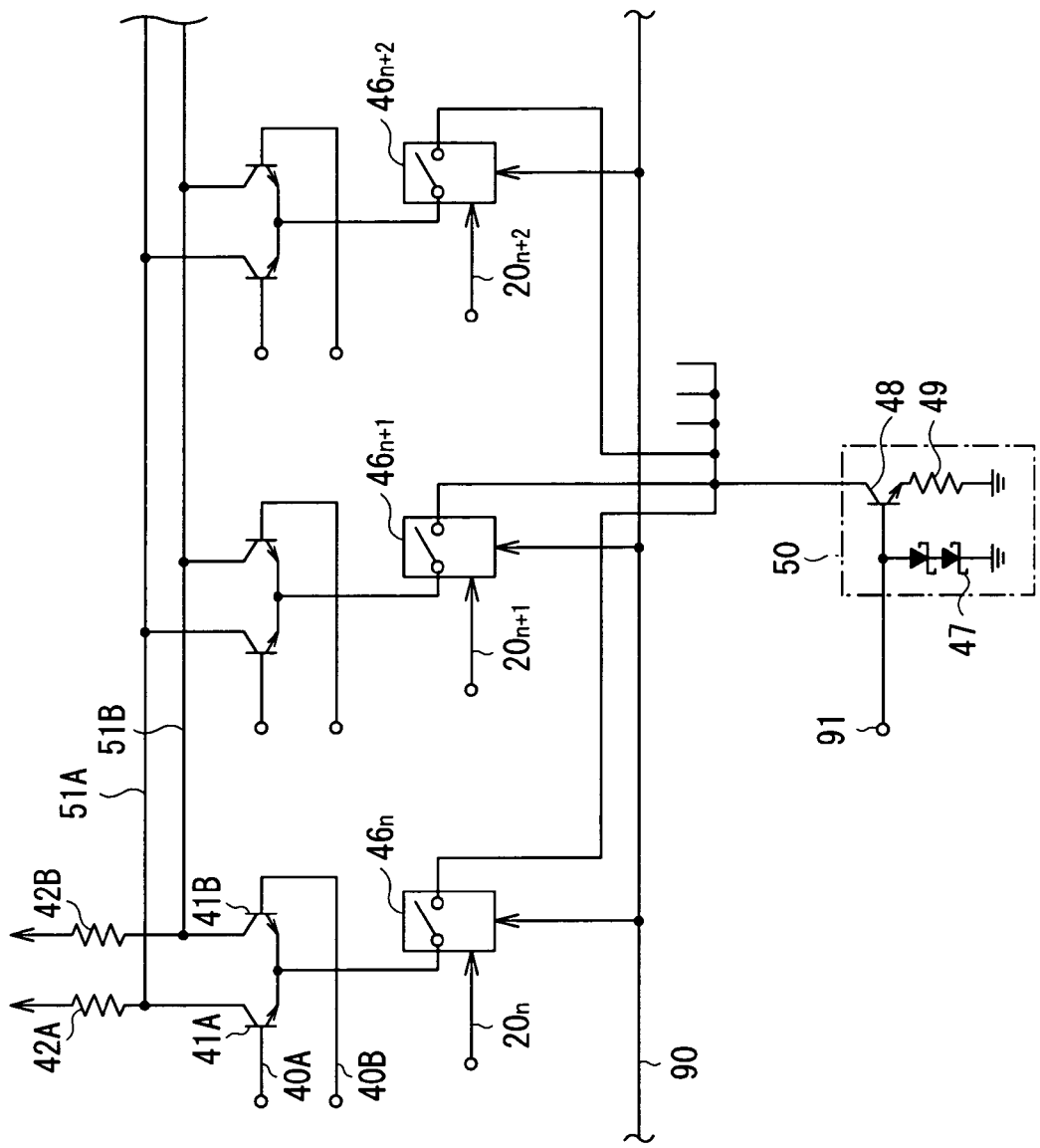
FIG. 19 is a structural diagram of a sense amplifier according to a second embodiment of the invention.

FIG. 19 shows an illustration of the structure of a sense amplifier according to a second embodiment. In this case, a circuit portion including the diode 43, the transistor 44 and the resistor 45 in the first embodiment is considered as a constant current circuit 50, and is shared among the sense amplifiers 106B. In the embodiment, like components are denoted by like numerals as of the first embodiment, and will not be further described.

In each sense amplifier 106B, the transistors 41A and 41B are commonly connected to one constant current circuit 50 through switches 46 ( . . . , 46n, 46n+1, . . . ). In other words, one sense amplifier 106B is selected by the switch 46, and the constant current circuit 50 operates as a part of the selected sense amplifier 106B.

In this case, corresponding bit decode lines 20 ( . . . , 20n, 20n+1, . . . ) and a read selection signal line 90 are connected to the switches 46 ( . . . , 46n, 46n+1, . . . ). A read/write signal for selecting whether the magnetic memory device performs a read operation or a write operation is transferred from the read selection signal line 90, and the switch 46 opens or closes according to both of the bit decode value and the read/write signal. For example, the read/write signal is a logical sum of a chip select signal (CS) which is inputted into a control logic portion 103, and controls whether or not to make the magnetic memory device active, and a write enable signal (WE) for switching between the read operation and the write operation, and the read selection signal line 90 is drawn from the control logic portion 103 to the sense amplifier 106B (refer to FIG. 1).

In other words, a readout circuit system reads information only in the case where the read operation is commanded by the switching operation of the switch 46, and in the case where information is read out, the sense amplifier 106B corresponding to a selected bit array Yn is selected as a target for operation.

Figures 20, 21:
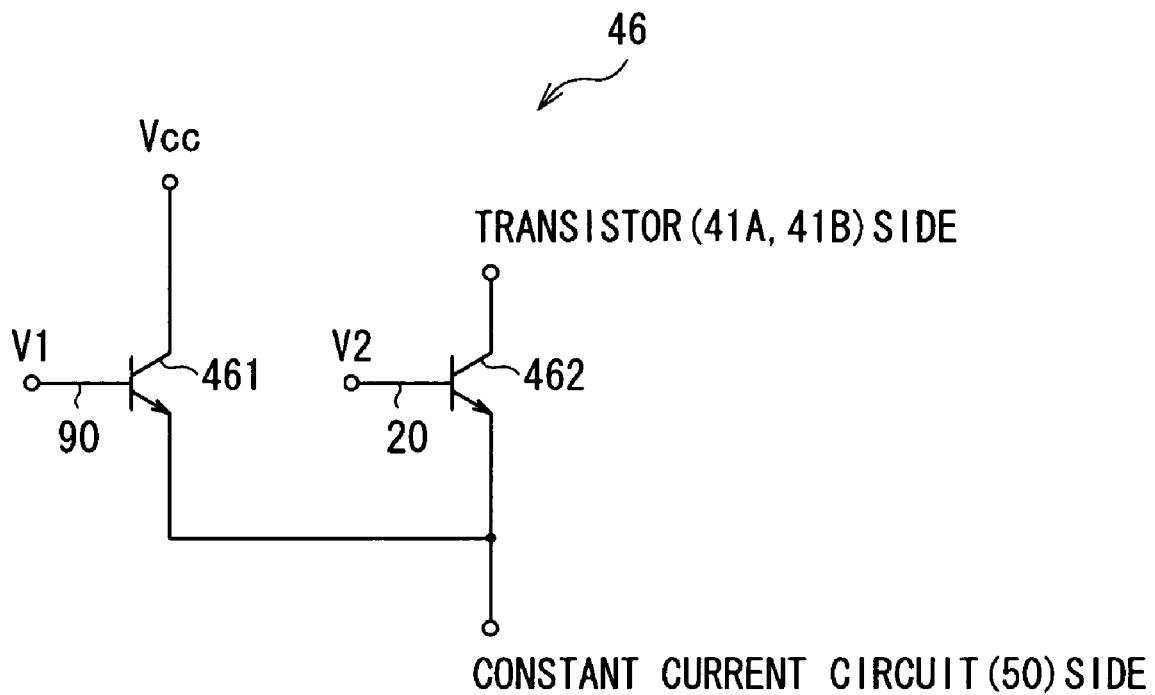
FIG. 20 is an illustration showing a specific example of a switch shown in FIG. 19.
FIG. 21 is a table showing the operation state of the switch shown in FIG. 20 according to input control signals.

The switch 46 has, for example, the following structure. FIG. 20 shows the structure, and FIG. 21 shows the operation state of the switch according to input signals. The switch 46 includes a transistor 461 in which the read selection signal line 90 is connected to the base terminal thereof, and a transistor 462 in which the bit decode line 20 is connected to the base terminal thereof. The collector-emitter of the transistor 462 is connected between the emitter terminals of the transistors 41A and 41B and the transistor 48 in the constant current circuit 50. Moreover, the collector terminal of the transistor 461 is connected to the power source (Vcc), and the emitter terminal of the transistor 461 is connected to the emitter of the transistor 462. In the switch, it is necessary that a voltage value V1 (a voltage value of the read/write selection signal) in the case where the base input voltage of the transistor 461 is "High", and a voltage value V2 (a voltage value of the bit decode value) in the case where the base input voltage of the transistor 462 is "High" are set to have a relationship of V1−V2>0.3 (Volt). The voltage values are adjusted before the stage of the switch 46, and for the sake of simplification, detailed description will not be given.

In the switch 46, when the base voltage of the transistor 461 is "Low", the transistor 461 is brought into a cutoff state, so the operation of the transistor 462, that is, the conduction/cutoff as the switch 46 is determined according to the signal value inputted into the transistor 462.

On the other hand, when "High" is inputted into the base terminal of the transistor 461, the operation of the conducted transistor 461 is dominant, so no current flows between the collector and the emitter of the transistor 462 irrespective of the inputted signal. In other words, in this case, the switch 46 is brought into a cutoff state. When the transistor 461 is brought into conduction, a current larger than a current flowing through the transistor 462 flows through the transistor 461 (for example, V1−V2>0.3 (Volt)). Moreover, it is found out that the resistance in a path from the power source (Vcc) to the transistor 461 is much higher than that in a path from the power source (Vcc) to the transistor 462. Therefore, even if "High" is inputted into the transistor 462, a current supplied from the power source (Vcc) flows not into the transistor 462 but into the transistor 461. Moreover, in this case, the potential of the connection point P (the common emitter voltage of the transistors 461 and 462) is a value equal to V1 from which a forward voltage between the base and the emitter of the transistor 461 is subtracted. As a result, the voltage applied between the base and the emitter of the transistor 462 is 0.3 V lower than the forward voltage between the base and the emitter of the transistor 462, so it is difficult for a current to flow through the transistor 462.

Thus, the switch 46 is conducted only in the case where "Low" is inputted into the transistor 461, and "High" is inputted into the transistor 462. Therefore, the read/write signal in this case is set to "Low" when the read operation is commanded, and is set to "High" when the write operation is commanded. The switch 46 in this case brings the transistors 41A and 41B in the sense amplifier 106B and the constant current circuit 50 into conduction or out of conduction, and does not limit the operation of the constant current circuit 50.

The constant current circuit 50 includes the diode 47, the transistor 48 and a resistor 49, and produces a constant current through the use of a bandgap reference of the diode 47. The constant current circuit 50 functions as in the case of the constant current circuit 108B described in the first embodiment, and determines the total sum of current amounts flowing through the transistors 41A and 41B. In other words, the constant current circuit 50 operates so as to keep the differential output value of the sense amplifier 106B within a constant range. Moreover, the transistor 48 functions as a switch of which the base terminal is connected to a constant current circuit control terminal 91.

A control signal at a voltage level which can bring the transistor 48 into a cutoff state is inputted into the constant current circuit control terminal 91, and the constant current circuit control terminal 91 can bring all of the sense amplifier circuits 106B among which the constant current circuit 50 is shared into an active state or a standby state.

In the first embodiment, a circuit portion including the diode 43, the transistor 44 and the resistor 45 has a constant current function, and the transistor 44 is opened or closed according to the bit decode value, thereby, each sense amplifier 106B is controlled to be active or not. On the other hand, in the embodiment, the constant current circuit 50 has the constant current function, and the switch 46 performs a switching operation for selecting the sense amplifier 106B according to the bit decode value. In this case, the switch 46 corresponds to "a first switch" in the invention, and the transistors 22A and 22B correspond to "a pair of second switches" in the invention.

Such a sense amplifier 106B operates as below.

At first, the read/write signal is inputted into the read selection signal line 90. When the signal voltage value is "High", the write operation is commanded, and the switch 46 is not brought into conduction. When the signal value is "Low", the read operation is commanded, and each switch 46 is opened or closed according to the inputted bit decode value.

The bit decode line 20 and the word decode line 30 corresponding to the address of the storage cell 12 are selected almost concurrently with these operations. Thereby, the transistors 22A and 22B and the transistor 33 are brought into conduction, and a sensing current flows from the sense bit lines 21A and 21B to the sense word line 31 through the magnetoresistive devices 12A and 12B targeted for reading. On the other hand, in a plurality of sense amplifiers 106B arranged in parallel, a bit decode value from the bit decode line 20 is inputted into one switch 46.

Therefore, only one switch 46 in a selected block is selectively brought into conduction, and there is conduction between the transistors 41A and 41B corresponding to the selected switch 46 and the constant current circuit 50, and a corresponding sense amplifier 106B can operate. In other words, only in the case where the read operation is commanded by the read/write signal, only the sense amplifier 106B corresponding to a bit array selected by the bit decode value is selectively brought into an active state. Thus, the selected sense amplifier 106B differentially amplifies a potential difference taken out from the input lines 40A and 40B, and transfers the potential difference to the output lines 51A and 51B. At this time, each sense amplifier 106B uses the same constant current circuit 50 as a component, so variations in output values between the sense amplifiers 106B in each bit array can be prevented.

Thus, in the embodiment, one constant current circuit 50 is shared among a plurality of sense amplifiers 106B arranged in parallel, so the number of components can be largely reduced. When a voltage of "High" is applied to the base terminal of the transistor 48, the sense amplifier 106B selected by the bit decode value is brought into an active state, and the constant current circuit 50 consumes power. Therefore, sharing the constant current circuit contributes to a reduction in unnecessary power consumption by a plurality of constant current circuits in the related art. Moreover, a path of a current flowing from the power source (Vcc) to the ground is formed only in the read operation, and only one path through the sense amplifier 106B targeted for reading is always used, so unnecessary power consumption except for a circuit portion which performs the read operation can be reduced. Further, the same constant current circuit 50 is shared among the sense amplifiers 106B, so variations in characteristics in the block can be prevented, and the total amount of currents flowing through the sense amplifiers 106B is normalized. Therefore, fluctuations in a current amplification factor in the transistors 41A and 41B in each sense amplifier 106B can be prevented, thereby the output of the sense amplifier can be always a constant value.

Moreover, the switch 46 is disposed so as to connect one of the transistors 41A and 41B to the constant current circuit 50, and the switch 46 operates by not only the read/write signal but also the logical sum of the bit decode value, so a readout circuit system can operate only in the case where the read operation is commanded, and only a circuit system corresponding to a selected bit array Yn operates. Thus, when the read/write signal is inputted into the switch 46, the whole readout circuit system can operate according to the read/write signal.

Further, when the constant current circuit control terminal 91 is connected to the base terminal of the transistor 48, and a control signal is inputted, the states of all sense amplifiers 106B which commonly uses the constant current circuit 50 can be controlled by the switching operation of the transistor 48. For example, when the transistor 48 is cut off, current consumption in the constant current circuit 50 is reduced, and it contributes to a reduction in power consumption.

As described above, the readout circuit system according to the embodiment operates by three control commands including the read/write signal, the bit decode value and the control signal from the constant current circuit control terminal 91, so the readout circuit system cannot operate until all conditions of three control signals are fulfilled. Therefore, circuits except for a necessary circuit are in a standby state when possible, and power consumption due to a leakage current can be largely reduced.

(Modification of Switch 46)

Figure 22:
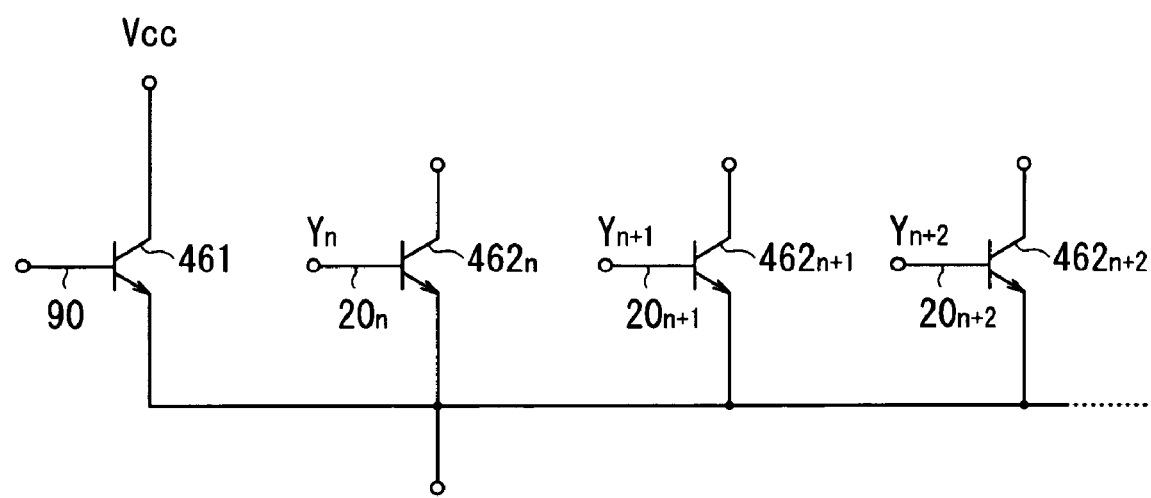
FIG. 22 is an illustration showing a modification of the switch shown in FIG. 20.

FIG. 22 shows the structure of a switch according to a modification of the second embodiment. In the second embodiment, one switch 46 is disposed corresponding to each sense amplifier 106B; however, in the modification, the functions of all switches 46 are put together into one switch. Only one transistor 461 connected to the read selection signal line 90 is disposed, and a plurality of transistors 462 (..., 462n, 462n+1, ...) connected to the bit decode lines 20 (..., 20n, 20n+1, ...) are disposed corresponding to the sense amplifiers 106B. The emitters of transistors 461 and 462 are commonly connected in parallel, and the transistor 461 is shared among a plurality of transistor 462 (..., 462n, 462n+1, ...).

The operation is the same as that of the switch 46 (refer to FIG. 21). When "Low" (write command) is inputted into the transistor 461, and the bit decode value is inputted into one of the transistors 462 ( . . . , 462n, 462n+1, . . . ), the selected transistor 462 is brought into conduction. For example, when the bit decode value Yn is inputted from the bit decode line 20n, only the transistor 462n is brought into conduction, and the sense amplifier 106B corresponding to a bit array Yn is brought into an active state. When "High" (write command) is inputted into the transistor 461, even if the bit decode value is inputted, all transistors 462 remains in cutoff state.

[Verification of Amplification by Sense Amplifier]

Figure 23:
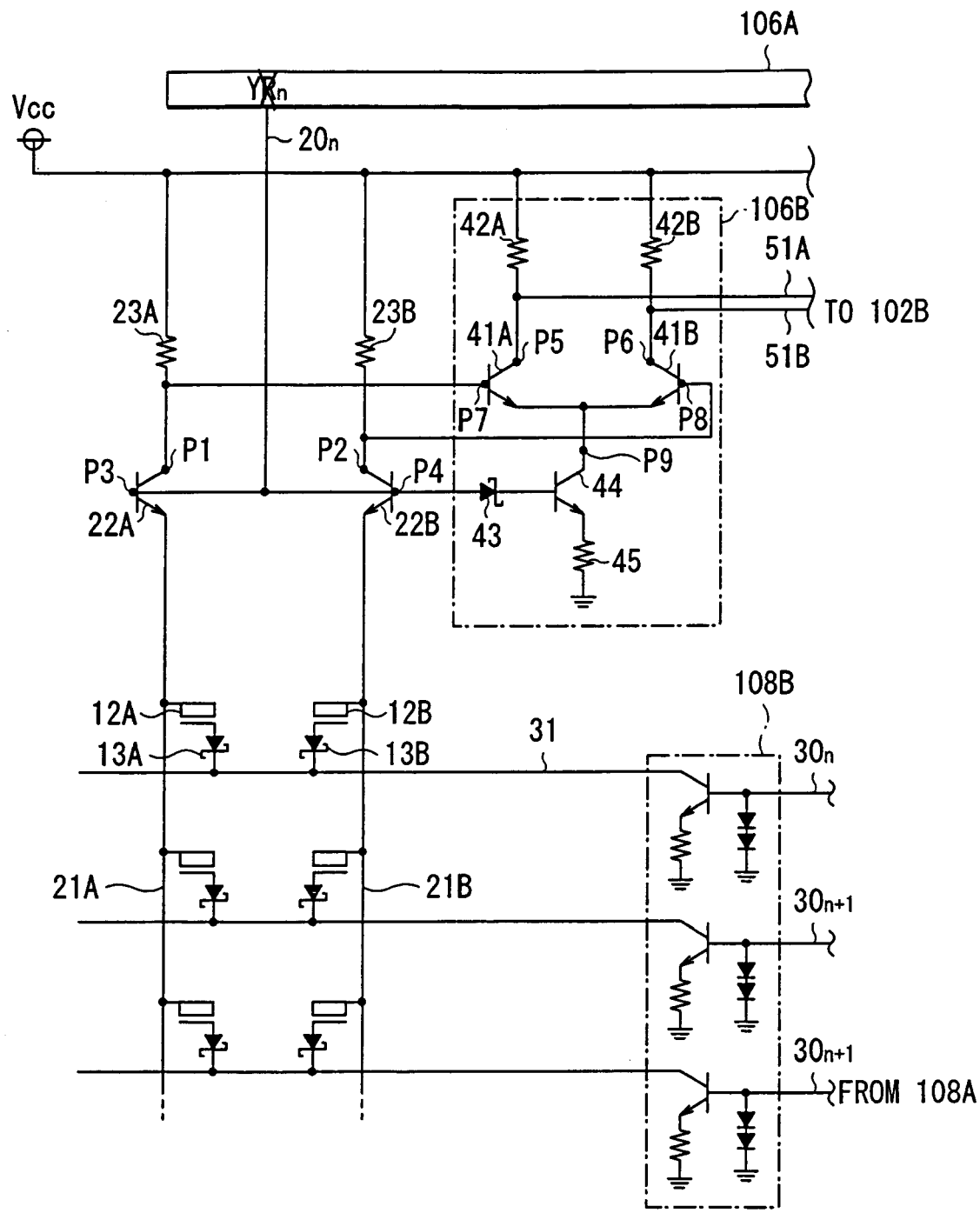
FIG. 23 is an illustration of a readout circuit according to an example of a magnetic memory device according to the invention.

In a real circuit (refer to FIG. 2) as in the case of the first embodiment, during reading information, a current value at each measurement point was measured through the use of a current probe. There were 9 measurement points P1 through P9 shown in FIG. 23, that is, the measurement point P1 . . . the collector terminal of the transistor 22A, the measurement point P2 . . . the collector terminal of the transistor 22B, the measurement point P3 . . . the base terminal of the transistor 22A, the measurement point P4 . . . the base terminal of the transistor 22B, the measurement point P5 . . . the collector terminal of the transistor 41A, the measurement point P6 . . . the collector terminal of the transistor 41B, the measurement point P7 . . . the base terminal of the transistor 41A, the measurement point P8 . . . the base terminal of the transistor 41B, and the measurement point P9 . . . the collector terminal of the transistor 44.

The current values at the measurement points were measured through changing the value of a bit decode voltage applied to the bit decode line 20.

Figure 24:
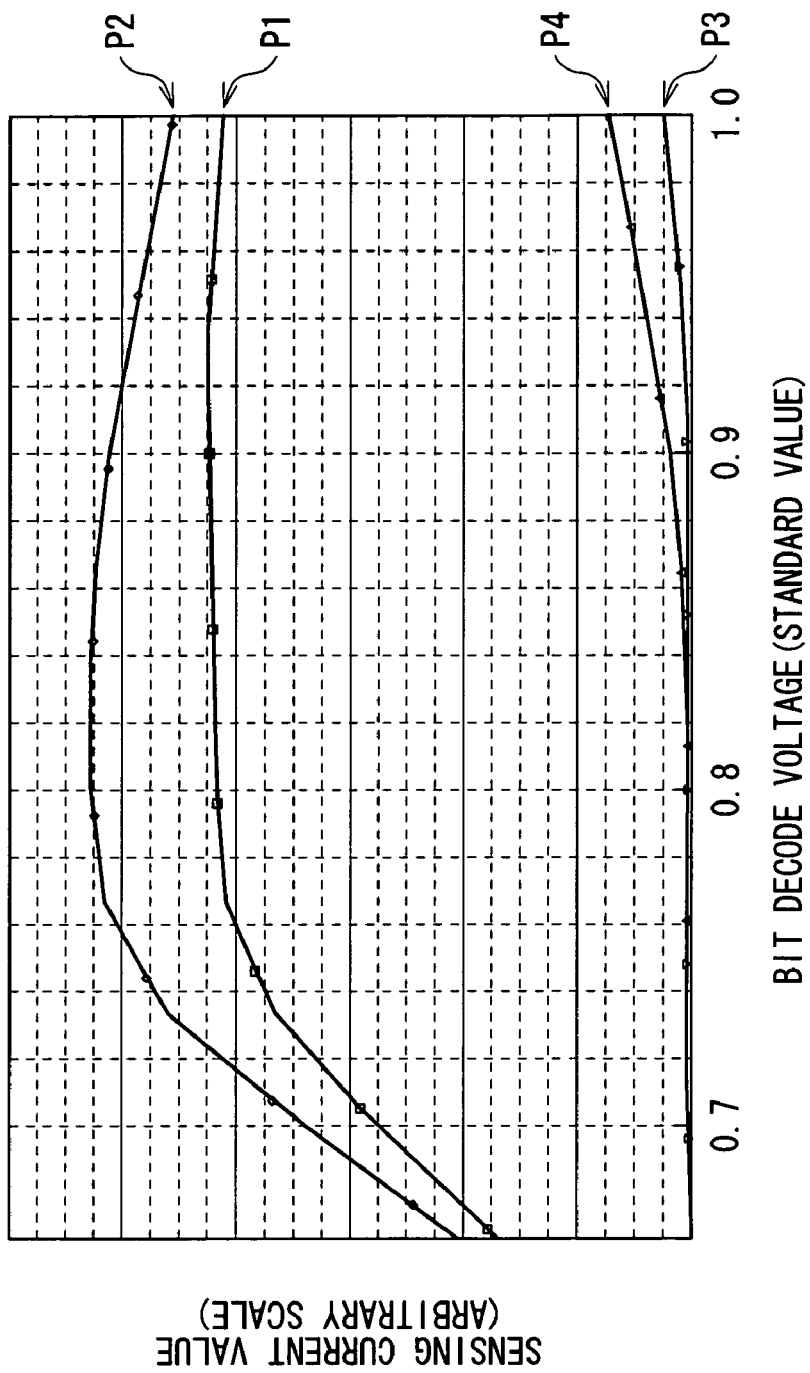
FIG. 24 is a plot showing a relationship between bit decode voltage and measured current values at measurement points P1 through P4 in the readout circuit shown in FIG. 19.

FIG. 24 shows the measurement results at the measurement points P1 through P4. In the real circuit, a current flowing through the sense bit line 21A on a side connected to the magnetoresistive device 12A was an emitter current of the transistor 22A, that is, the total sum of a collector current and a base current of the transistor 22A. It was found out from the measurement results that a collector current at the measurement point P1 was large to such an extent that the base current at the measurement point P3 was negligible. Therefore, it was found out that a current at the collector end of the transistor 22A and a current at the emitter end of the transistor 22A were substantially the same. Moreover, a relationship between the collector current at the measurement point P2 and the base current at the measurement point P4 in the transistor 22B was the same as that in the transistor 22A, and it was found out that a current at the collector end of the transistor 22B and a current at the emitter end of the transistor 22B were substantially the same.

Figure 25:
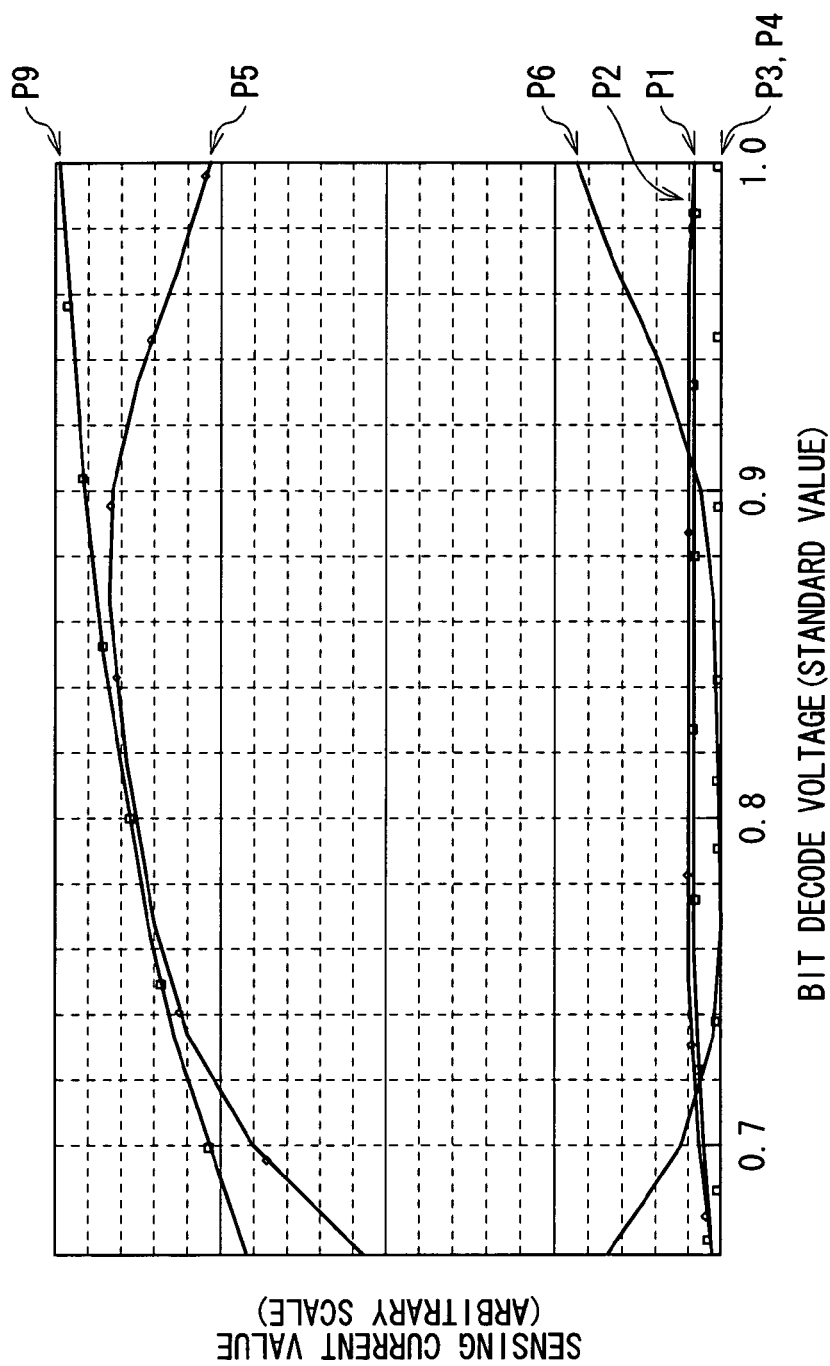
FIG. 25 is a plot showing a relationship between a bit decode voltage and measured current values at measurement points P1 through P9.

FIG. 25 shows the measurement results at the measurement points P1 through P9 (the scale of a current value on a vertical axis is different from that in FIG. 20). A current flowing through the current-voltage conversion resistors 23A and 23B was branched to flow into the collector terminals of the transistors 22A and 22B which were switches for bit array selection and the base terminals of the transistors 41A and 41B which were a differential pair of the sense amplifier 106B. Moreover, the total sum of the collector current and the base current of the transistor 41A and the total sum of the collector current and the base current of the transistor 41B were emitter currents, and the emitter currents were combined in a common wire to flow into the collector terminal of the transistor 44.

The collector currents of the transistors 41A and 41B were obtained through amplifying each base current (currents at the measurement points P7 and P8). It was found out from the measurement results that a difference between the collector current of the transistor 41A at the measurement point P5 and the collector current of the transistor 41B at the measurement point P6 was much larger than a difference between currents from the sense bit lines 21A and 21B as original outputs. The ratio of the current difference is approximately 200 times larger in the case of the measurement data shown in the drawing. Therefore, it was found out that in the magnetic memory device, when the read signal was amplified by the sense amplifier 106B, a very large output could be obtained.

It was found out from the measurement results that the base currents of the transistors 41A and 41B at the measurement points P7 and P8 were very small, and it might be said that currents flowing through the current-voltage conversion resistors 23A and 23B were substantially the same as currents flowing into the collector terminals of the transistors 22A and 22B. Therefore, in the readout circuit, it could be confirmed that the sense amplifier 106B amplified a change in currents through the magnetoresistive devices 12A and 12B faithfully.

[Verification of Effect of Constant Current Circuit]

Next, in a real circuit as in the case of the embodiment, two cases of fluctuations in the read signal (voltage) according to variations in the resistance of the magnetoresistive device 12A (12B) were examined.

(Effect Against Variations in Resistance Between Storage Cells)

At first, the case where the resistance ($R_L$) at a low resistance state and the resistance ($R_H$) in a high resistance state of the magnetoresistive devices 12A and 12B differed among the storage cells 12 was examined. In other words, the output value of a read voltage from the storage cell 12 having different resistances $R_L$ and $R_H$ were measured. In this case, the resistance in each storage cell 12 was changed from the minimum value to the maximum value which was approximately 10 times larger than the minimum value, and the MR ratio ($R_L/R_H$) in each storage cell 12 was fixed to 25%.

Figure 26:
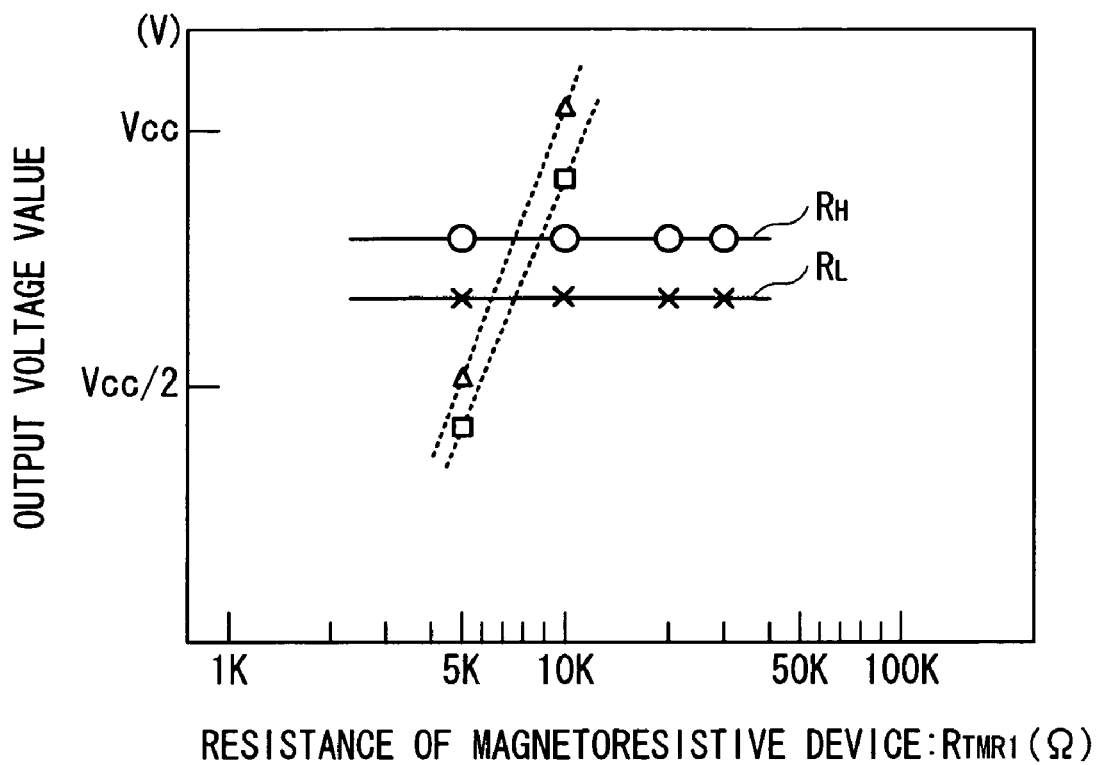
FIG. 26 is a plot showing a relationship between resistance fluctuations per storage cell of a magnetic storage device and an output voltage in the readout circuit shown in FIG. 19.

FIG. 26 shows the measurement results, and the horizontal axis indicates the resistance $R_{TMR1}$ of the magnetoresistive device, and the vertical axis indicates an output voltage value normalized by the power source voltage Vcc. In the drawing, a white circle indicates the output voltage value from the magnetoresistive device 12A (12B) having the resistance $R_H$ in a high resistance state, and a symbol x indicates the output voltage value from the magnetoresistive device 12B (12A) having the resistance $R_L$ in a low resistance state. Moreover, the measurement values were connected by a solid line, and a dotted line indicates the result in a comparative example with a structure in which a current flows through a pair of magnetic storage device and voltage drops across the magnetic storage devices are directly sensed.

It was obvious from the results shown in the drawing that in the readout circuit according to the embodiment, even if the resistance largely differed among storage cells, the output voltage from a side of the resistance $R_L$ and the output voltage from a side of the resistance $R_H$ were substantially constant values. Therefore, it was confirmed that a final output voltage which was a difference between them was always constant irrespective of variations in resistance in each storage cell 12. As described in the embodiment, this was an effect obtained through disposing the constant current circuit 108B and normalizing the total of currents flowing through the magnetoresistive devices 12A and 12B having the resistances $R_L$ and $R_H$.

COMPARATIVE EXAMPLE

Figure 27:
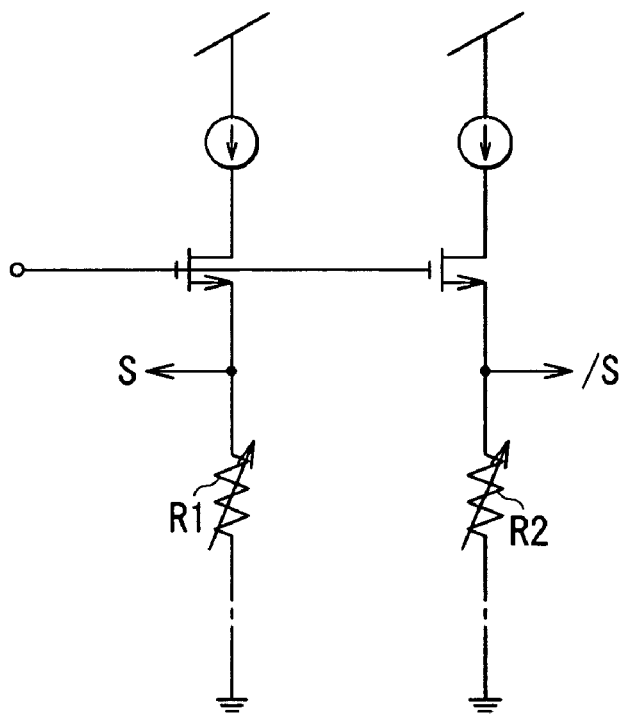
FIG. 27 is an equivalent circuit diagram for describing a readout circuit of a comparative example relative to an example shown in FIG. 22.

The same measurement was performed on a readout circuit with a structure in which a current flew through a pair of magnetic storage devices, and voltage drops across the magnetic storage devices were directly sensed as a comparative example relative to the example. FIG. 27 shows an equivalent circuit diagram of the comparative example. The readout circuit had a system of reading a difference between the voltages of a pair of magnetic storage devices (shown as variable resistors R1 and R2) which stored information considering one of the magnetic storage devices as high resistance and the other as low resistance, and each of the pair of magnetic storage devices was connected to a current source and a semiconductor switch for cell selection in series, and the series wirings in the pair of magnetic storage devices are independent of each other. Moreover, in this case, voltage drops across the magnetic storage devices were directly read out as S and /S, so the current-voltage conversion resistor was not used. The measurement result is indicated by a dotted line in FIG. 26. Thus, in a circuit which made a current through each magnetic storage device constant, the output value was largely changed in proportion to the resistance of the magnetic storage device. Therefore, variations in the resistance of the magnetic storage device directly caused fluctuations in the output value.

(Effect Against Variations in Resistance Between Magnetic Storage Devices)

Next, the case where the MR ratio varied between a pair of magnetoresistive devices 12A and 12B in each storage cell 12 was examined. In this case, the MR ratio of each storage cell 12 was changed through fixing the resistance $R_H$, and changing the resistance $R_L$, thereby the output voltages were measured.

Figure 28:
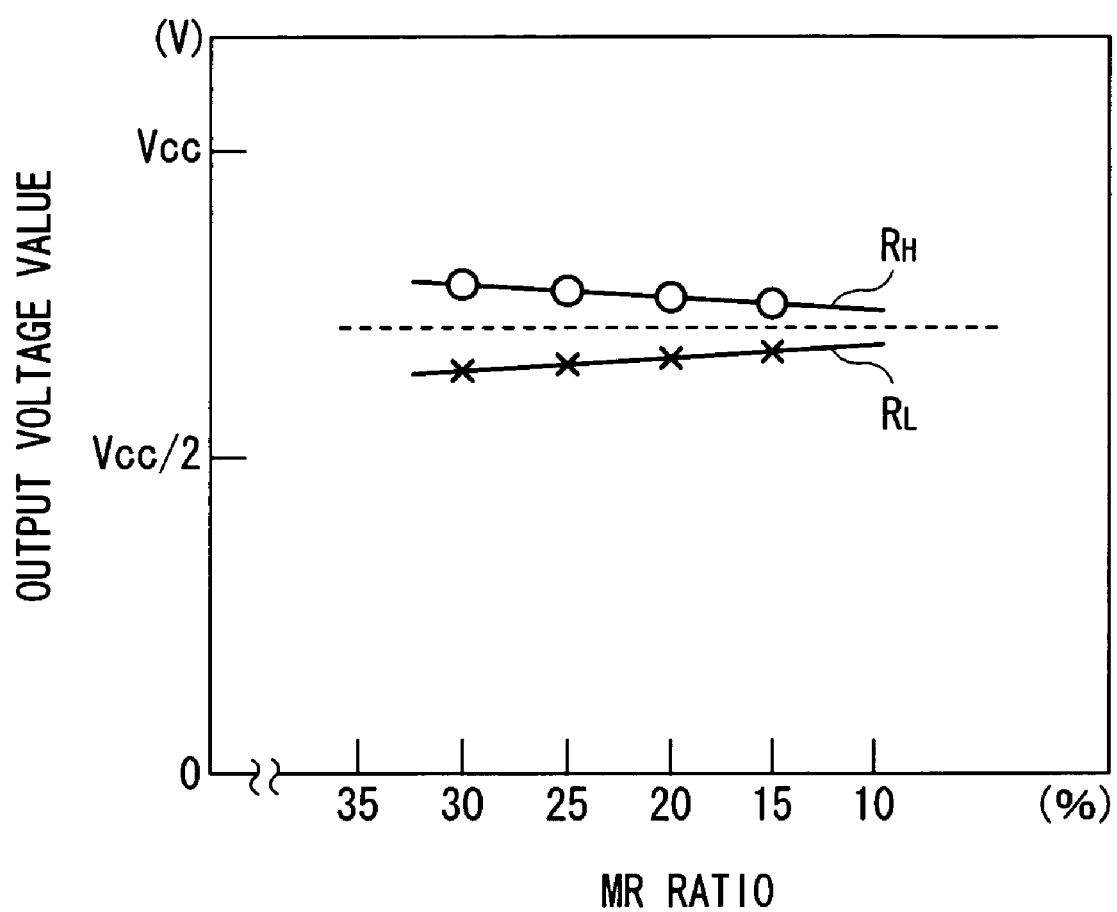
FIG. 28 is a plot showing a relationship between resistance fluctuations between a pair of magnetic storage devices and an output voltage in the readout circuit shown in FIG. 19.

FIG. 28 shows the measurement results, and the horizontal axis indicates a MR ratio (%), and the vertical axis indicates an output voltage value normalized by a power source voltage Vcc. In the drawing, a white circle indicates an output voltage value from the magnetoresistive device 12A (12B) with the resistance $R_H$, and a symbol x indicates an output voltage value from the magnetoresistive device 12B (12A) with the resistance $R_L$. Moreover, the measurement values are connected by a solid line, and a dotted line indicates an offset reference value relative to voltages from the magnetoresistive devices 12A and 12B having the resistances $R_H$ and $R_L$ by a constant current effect.

It was found out from the result shown in the drawing that in the readout circuit according to the embodiment, there was a tendency that the output voltage from a side of the resistance $R_L$, and the output voltage from a side of the resistance $R_H$ are asymptotic to each other with a decrease in the MR ratio. In other words, it was found out that variations in the MR ratio in each storage cell 12 affected the voltage outputs in such a manner. However, the output voltage on the side of the resistance $R_L$ and the output voltage on the side of the resistance $R_H$ fell within a constant range across the reference value. In this case, as long as the MR ratio was approximately 15% or more, a difference between the output values was sufficient, so compared to the case where the constant current circuit was not included in the same circuit structure, the possibility that a reading error occurred was reduced.

Moreover, in a circuit with such a structure, in general, the total sum of the currents flowing through the magnetoresistive devices 12A and 12B was always the same, so each of the currents was a value vertically symmetric with respect to half the total sum according to a ratio of the device resistance at this time. The offset reference value indicated by a dotted line in FIG. 28 was a voltage into which half the total sum was converted, and the position of the offset reference value was unchanged unless the total sum of currents was changed. Therefore, when a voltage level as a threshold at the time of differential amplification by the sense amplifier 106B agreed with the offset reference value, an appropriate value of the voltage output could be obtained from the sense amplifier 106B. This was an effect obtained through including the constant current circuit.

The invention is not specifically limited to the above-described embodiments and the examples, and can be variously modified. For example, in the above-described embodiments, bipolar transistors are used as switching devices such as the sense amplifier 106B, the constant current circuit 108B and the transistors 22A and 22B; however, instead of the bipolar transistors, semiconductor devices such as CMOSs (Complementary MOSs) can be used. A MOSFET or a logic gate may be used as a switch with two or more control commands such as the switch 46.

Moreover, in the second embodiment, the circuit system of the sense amplifier 106B is controlled by two control signals inputted into the switch 46 and one control signal inputted into the transistor 48; however, a circuit structure in which the switch 46 is replaced with a switch with three control commands operating according to three control signals can be used.

Further, in the above-described embodiments, the case where the magnetoresistive devices 12A and 12B are TMR devices is described; however, the magnetoresistive devices in the magnetic memory device according to the invention may be any kind of devices, as long as one unit information is stored by two devices. For example, the TMR devices can be replaced with CPP (Current Perpendicular to the Plane)-GMR devices with a structure in which a current flow in a direction perpendicular to a laminate surface of a magnetic layer. The device structure in this case can be the same as that of the above-described magnetoresistive device 12A (12B), except that as the non-magnetic layer 2, a non-magnetic metal layer is used instead of an insulating layer. Moreover, a pair of magnetoresistive devices may be magnetoresistive devices (CIP (Current flows In the Plane)-GMR) including a laminate in which a current flows in a direction parallel to the laminate surface of the magnetic layer.

As described above, in the magnetic memory device according to the invention, a pair of read lines which supply a read current to a pair of magnetoresistive device and a sense amplifier circuit which reads information from a storage cell on the basis of a difference between a pair of read currents flowing through the pair of read lines are included, and the sense amplifier circuit includes a differential switch pair disposed for each pair of read lines, a bias resistor pair disposed between each differential switch pair and a power source, and a constant current circuit which is shared among a plurality of differential switch pairs, and makes the sum of a pair of read currents flowing through each differential switch pair constant, so the characteristics of the constant current circuit are made uniform, and variations in a current amplification factor in each differential switch pair can be prevented. Thereby, a stable differential output can be obtained from the sense amplifier circuit, and the S/N ratio of a read signal output can be improved. At the same time, a plurality of constant current circuits disposed corresponding to each sense amplifier circuit are unified, so the number of components can be reduced, and unnecessary power consumption caused by flowing a current through a circuit portion which is not a target for operation can be prevented. Moreover, as the sense amplifier circuit has such a structure, in a readout circuit system, a current path from the power source to the ground can be limited to only one path through one sense amplifier circuit, so unnecessary power consumption can be reduced.

In particular, when the first switch which is disposed between each of a plurality of differential switch pairs and the constant current circuit and selects one among the plurality of differential switch pairs, and a pair of second switches which are disposed between the power source and the read line pair and select whether or not to supply a read current to the read line pair are further included, conduction or cutoff between the differential switch pair and the constant current circuit can be selected by a switching state of the first switch, and only the sense amplifier circuit selected by a control signal inputted into the first switch can operate. Therefore, various operation controls on a circuit system including the sense amplifier circuit can be performed according to the control signal inputted into the first switch. Moreover, in the case where the sense amplifier circuit is not a target for operation, when the first switch is controlled to be cut off, thereby a current does not flow into the sense amplifier circuit, unnecessary power consumption can be prevented, and power consumption can be reduced.

Further, when the bias resistor pair is shared among the plurality of differential switch pairs, the characteristics of the bias resistor pair are made uniform, thereby variations in an offset amount relative to an output value in each sense amplifier circuit can be prevented, and it contributes to equalization of current amounts in the differential switch pair. Therefore, the S/N ratio of a read signal output can be improved. Further, the number of resistor components can be reduced, so unnecessary power consumption can be prevented.

When a pair of second switches, a pair of current-voltage conversion resistors and a differential switch pair are packed in the same region, the pairs of devices are closely disposed, so an environmental temperature is substantially the same, thereby the characteristic values of the pairs can be prevented from differing from each other due to a temperature change during driving, and these circuits securely perform an appropriate differential operation. Therefore, signal noises can be prevented.

In the sense amplifier circuit according to the invention, the differential switch pair disposed for each read line pair, bias resistor pairs disposed between each differential switch pair and a power source, and a constant current circuit which is shared among a plurality of differential switch pairs are included, and information is read out from a storage cell on the basis of a difference between a pair of read currents flowing through the read line pairs, so the characteristics of the constant current circuit are made uniform, and variations in a current amplification factor of each differential switch pair can be prevented. Thereby, a differential output per read line pair can be stably obtained from any line pairs, and the S/N ratio of a read signal output can be improved. Moreover, constant current circuits disposed corresponding to differential switch pairs are unified, so the number of components can be reduced, and unnecessary power consumption can be prevented. Further, in the magnetic memory device using the sense amplifier circuit, as a current path from the power source to the ground in a readout circuit system during driving, only one path through one sense amplifier circuit can be formed, so unnecessary power consumption can be reduced.

In a method reading from a magnetic memory device according to the invention, a differential switch pair is arranged for read line pair, and a bias resistor pair is arranged between each differential switch pair and a power source, and a constant current circuit is arranged so as to be shared among the plurality of differential switch pairs, and information is read out from a storage cell on the basis of a difference between a pair of read currents flowing through the read line pair, so the read currents are differentially outputted, and noises in each of the read lines, and an offset component included in an output value of each magnetoresistive device can be eliminated. In this case, the sense amplifier circuit which differentially amplifies a difference between the read currents as a voltage difference commonly use the constant current circuit, thereby variations in the output of the sense amplifier due to variations in characteristics of the constant current circuit can be prevented. Therefore, a stable differential output can be obtained, and the S/N ratio of a read signal output can be improved.

The invention claimed is:

1. A magnetic memory device, including a plurality of magnetoresistive devices each including a magnetic sensitive layer of which the magnetization direction changes by an external magnetic field, wherein one storage cell includes a pair of the magnetoresistive devices, the magnetic memory device comprising:
   a read line pair supplying a read current to the pair of magnetoresistive devices; and
   a sense amplifier circuit reading information from the storage cell on the basis of a difference between a pair of read currents flowing through the read line pair,
   wherein the sense amplifier circuit includes:
   a differential switch pair being disposed for each read line pair;
   a bias resistor pair being disposed between each differential switch pair and a power source; and
   a constant current circuit being shared among a plurality of the differential switch pairs, and making the sum of a pair of read currents flowing through each differential switch pair constant.

2. A magnetic memory device according to claim 1, further comprising:
   a current-voltage conversion resistor pair between the read line pair and the power source,
   wherein terminals of the current-voltage conversion resistor pair on a side opposite to a side closer to the power source are connected to the differential switch pair of the sense amplifier circuit.

3. A magnetic memory device according to claim 1, further comprising:
   a first switch being disposed between each of a plurality of the differential switch pairs and the constant current circuit, and selecting one among the plurality of differential switch pairs; and
   a pair of second switches being disposed between the power source and the read line pair, and selecting whether or not to supply a read current to the read line pair or not.

4. A magnetic memory device according to claim 3, wherein
switching of the first and the second switches is controlled according to a first selection signal for selecting one among the plurality of differential switch pairs.

5. A magnetic memory device according to claim 3, wherein
switching of the first switch is controlled by a first selection signal for selecting one among the plurality of differential switch pairs and a second selection signal indicating a read mode, and
switching of the second switches is controlled by the first selection signal.

6. A magnetic memory device according to claim 1, wherein
the constant current circuit uses a bandgap reference.

7. A magnetic memory device according to claim 6, wherein
the constant current circuit includes:
a current limiting transistor;
a diode being connected between the base of the current limiting transistor and the ground; and
a current controlling resistor being connected between the emitter of the current limiting transistor and the ground.

8. A magnetic memory device according to claim 1, wherein
the bias resistor pair is also shared among a plurality of the differential switch pairs.

9. A magnetic memory device according to claim 3, wherein
the pair of second switches, the current-voltage conversion resistor pair and the differential switch pair are packed in the same region.

10. A magnetic memory device according to claim 9, wherein
the pair of second switches, the current-voltage conversion resistor pair and the differential switch pair each have a symmetric circuit structure.

11. A magnetic memory device according to claim 1, further comprising:
s plurality of first write lines; and
a plurality of second write lines extending so as to intersect with the plurality of first write lines,
wherein each of the plurality of magnetoresistive devices includes:
a laminate which includes the magnetic sensitive layer and through which a current flows in a direction perpendicular to a laminate surface; and
a toroidal magnetic layer which is disposed on one surface of the laminate so that its direction along the laminate surface is its axial direction, and the first and the second write lines pass through the toroidal magnetic layer.

12. A magnetic memory device according to claim 1, wherein
the magnetization directions of magnetic sensitive layers in the pair of magnetoresistive devices are changed by a magnetic field which is induced by currents flowing through the first and the second write lines so as to be antiparallel to each other, thereby information is stored in the storage cell.

13. A sense amplifier circuit, being applied to a magnetic memory device, the magnetic memory device which includes a plurality of magnetoresistive devices each including a magnetic sensitive layer of which the magnetization direction changes by an external magnetic field, and a read line pair supplying a read current to a pair of magnetoresistive devices, wherein one storage cell includes a pair of the magnetoresistive devices, the sense amplifier circuit comprising:
a differential switch pair being disposed for each read line pair;
a bias resistor pair being disposed between each differential switch pair and a power source; and
a constant current circuit being shared among a plurality of the differential switch pairs,
wherein information is read from the storage cell on the basis of a difference between a pair of read currents flowing through the read line pair.

14. A method of reading from a magnetic memory device, being applied to a magnetic memory device, the magnetic memory device which includes a plurality of magnetoresistive devices each including a magnetic sensitive layer of which the magnetization direction changes by an external magnetic field, and a read line pair supplying a read current to a pair of the magnetoresistive devices, wherein one storage cell includes a pair of the magnetoresistive devices,
the method comprising the steps of:
arranging a differential switch pair for each read line pair;
arranging a bias resistor pair between each differential switch pair and a power source;
arranging a constant current circuit so as to be shared among a plurality of differential switch pairs; and
reading information from the storage cell on the basis of a difference between a pair of read currents flowing through the read line pair.

* * * * *